United States Patent
Kellner-Werdehausen et al.

(10) Patent No.: US 11,646,365 B2
(45) Date of Patent: May 9, 2023

(54) SHORT-CIRCUIT SEMICONDUCTOR COMPONENT AND METHOD FOR OPERATING SAME

(71) Applicant: Infineon Technologies Bipolar GmbH & Co. KG., Warstein (DE)

(72) Inventors: Uwe Kellner-Werdehausen, Leutenbach (DE); Michael Stelte, Borchen-Etteln (DE); Markus Droldner, Ahlen (DE); Dirk Pikorz, Warstein (DE); Peter Weidner, Soest (DE); Reiner Barthelmess, Soest (DE); Mario Schenk, Warstein (DE); Jens Przybilla, Warstein (DE)

(73) Assignee: Infineon Technologies Bipolar GmbH & Co. KG., Warstein (DE)

( * ) Notice: Subject to any disclaimer, the term of this patent is extended or adjusted under 35 U.S.C. 154(b) by 192 days.

(21) Appl. No.: 16/965,432

(22) PCT Filed: Jan. 23, 2019

(86) PCT No.: PCT/EP2019/051557
§ 371 (c)(1),
(2) Date: Jul. 28, 2020

(87) PCT Pub. No.: WO2019/149581
PCT Pub. Date: Aug. 8, 2019

(65) Prior Publication Data
US 2021/0367067 A1    Nov. 25, 2021

(30) Foreign Application Priority Data
Feb. 1, 2018    (DE) ............. 10 2018 102 234.4

(51) Int. Cl.
*H01L 29/74* (2006.01)
*H01L 23/62* (2006.01)
(Continued)

(52) U.S. Cl.
CPC .......... *H01L 29/7428* (2013.01); *H01L 23/62* (2013.01); *H01L 27/0248* (2013.01); *H01L 29/42308* (2013.01); *H01L 29/7424* (2013.01)

(58) Field of Classification Search
CPC .................................................. H01L 29/7428
See application file for complete search history.

(56) References Cited

U.S. PATENT DOCUMENTS

| 3,577,046 A | 5/1971 | Moyson |
| 3,660,687 A | 5/1972 | Sahm et al. |

(Continued)

FOREIGN PATENT DOCUMENTS

| DE | 2204853 A1 | 9/1972 |
| DE | 1489092 B2 | 10/1972 |

(Continued)

OTHER PUBLICATIONS

German Office Action for Application No. 10 2018 102 234.4 dated Sep. 20, 2018, German Patent and Trademark office, Munich, Germany.

(Continued)

*Primary Examiner* — Matthew C Landau
*Assistant Examiner* — Mark Hatzilambrou
(74) *Attorney, Agent, or Firm* — Murphy, Bilak & Homiller, PLLC

(57) ABSTRACT

A short-circuit semiconductor component comprises a semiconductor body, in which a rear-side base region of a first conduction type, an inner region of a second conduction type complementary to the first conduction type, and a front-side base region of the first conduction type are disposed. The rear-side base region is electrically connected to a rear-side electrode with a rear-side electrode width, and the front-side base region is electrically connected to a front-side electrode with a front-side electrode width. A turn-on structure with a (Continued)

Figure 1:
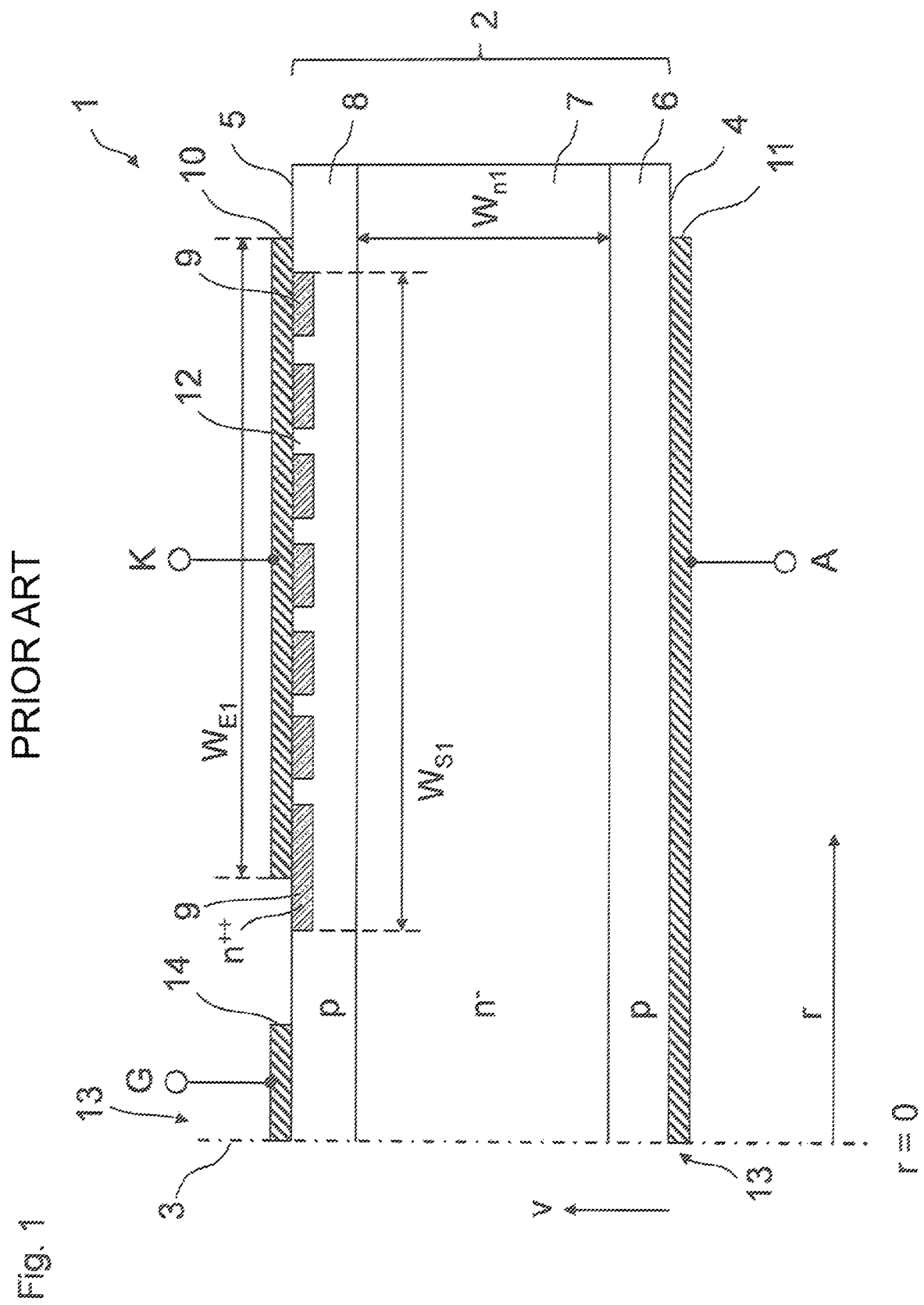

turn-on structure width is embedded into the front-side and/or rear-side base region and is covered by the respective electrode. The turn-on structure is configured to be turned on depending on a supplied turn-on signal and to produce, on a one-off basis, an irreversible, low-resistance connection between the two electrodes. The ratio of the turn-on structure width to the respective electrode width is less than 1.

18 Claims, 18 Drawing Sheets

(51) Int. Cl.
*H01L 27/02* (2006.01)
*H01L 29/423* (2006.01)

(56) References Cited

U.S. PATENT DOCUMENTS

| | | |
|---|---|---|
| 4,542,398 A | 9/1985 | Yatsuo et al. |
| 4,775,883 A | 10/1988 | Borchert et al. |
| 5,969,922 A | 10/1999 | Pezzani |
| 9,741,839 B1 | 8/2017 | Nakagawa |
| 2021/0367067 A1 | 11/2021 | Kellner-Werdehausen et al. |

FOREIGN PATENT DOCUMENTS

| | | |
|---|---|---|
| DE | 3134074 A1 | 5/1982 |
| DE | 4215378 C1 | 9/1993 |
| DE | 10333798 A1 | 2/2005 |
| DE | 102004025082 B4 | 12/2006 |
| DE | 102008049678 A1 | 4/2010 |
| DE | 102009045216 A1 | 4/2011 |
| DE | 10323220 B4 | 7/2014 |
| DE | 102018102234 A1 | 8/2019 |
| EP | 0463913 A1 | 1/1992 |
| EP | 3001525 A1 | 3/2016 |
| EP | 3721472 A1 | 10/2020 |
| JP | 57118671 | 7/1982 |
| WO | 2019149581 A1 | 8/2019 |

OTHER PUBLICATIONS

The International Search Report and The Written Opinion of the International Searching Authority for PCT/EP2019/051557, dated Apr. 23, 2019, EPO/NL, Rijswijk, The Netherlands.

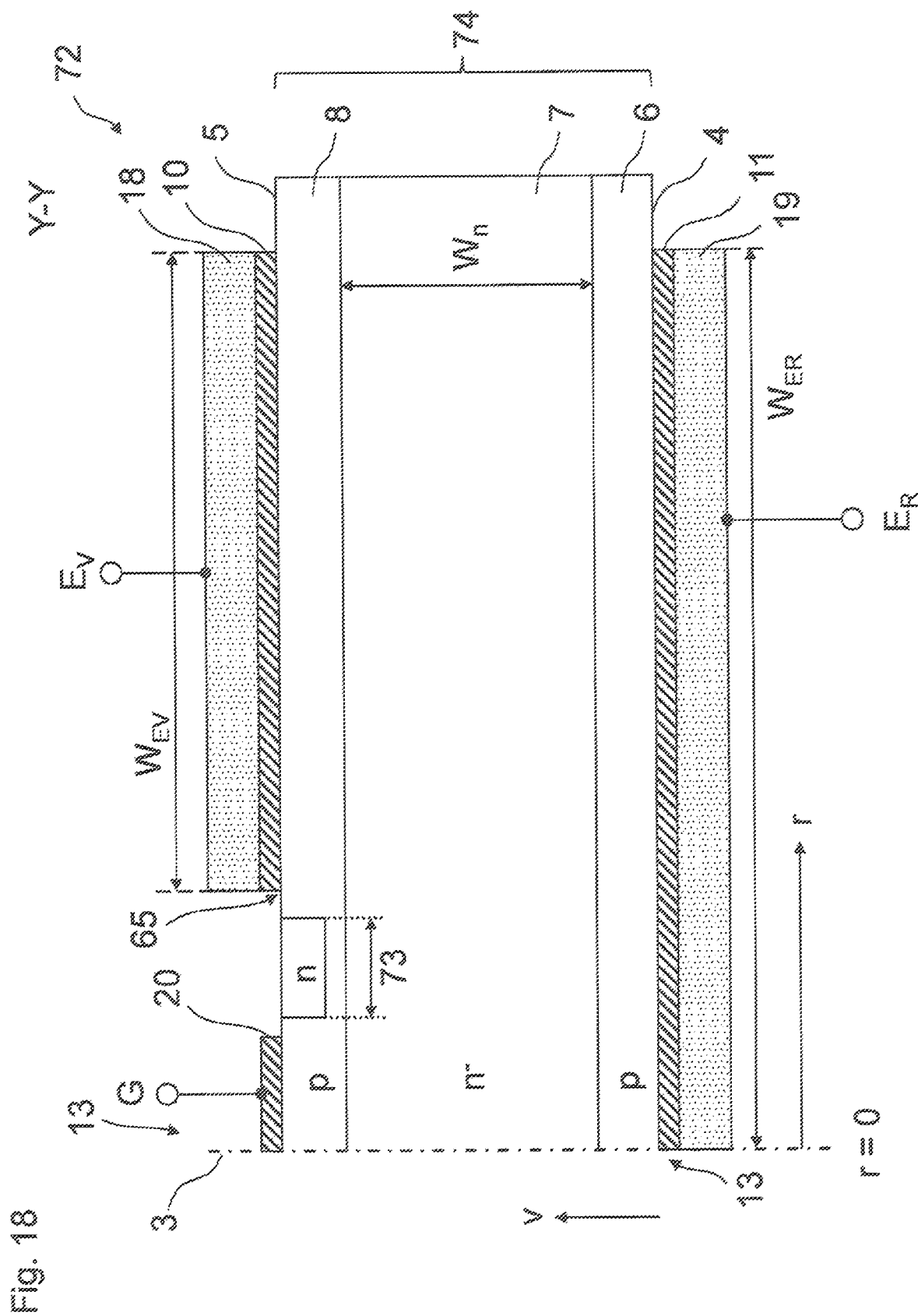

SHORT-CIRCUIT SEMICONDUCTOR COMPONENT AND METHOD FOR OPERATING SAME

CROSS-REFERENCE TO RELATED APPLICATIONS

This application claims priority under 35 U.S.C. § 371 to the International Application No. PCT/EP2019/051557, filed Jan. 23, 2019, and to the German Application No. 10 2018 102 234.4, filed Feb. 1, 2018, now pending, the contents of which are hereby incorporated by reference.

The present invention relates to a short-circuit semiconductor component according to the preamble of claim 1 and to a method for operating such a short-circuit semiconductor component.

Subsequent to certain cases of failures or incidents, all the components and, in particular, the power semiconductors in, for example, converter systems may be destroyed by excessive short-circuit and overload currents, which may amount to several 100 kA. The use of various protective devices for reliably preventing the destruction of the components in the systems, particularly of the semiconductor components, is known.

When a case of failure occurs, a defined, permanently low-resistance connection (short circuit) may be generated, for example, by a safety switch in the form of a short circuit device. In this case, the protective device can be triggered once and, having been triggered by an electrical or optical triggering signal, remains permanently short-circuited.

For example, DE 103 23 220 B4 discloses a shorting circuit for a faulty partial converter, in which, in case of a failure, an electronic semiconductor component either absorbs a short-circuit current or is activated depending on such a short-circuit current and is then permanently shorted. An active semiconductor switch, which, in particular, may be configured as a conventional thyristor, is proposed as an electronic semiconductor component. The latter is triggered in a case of failure, whereupon the short-circuit current flowing through the thyristor causes a local overheating of the semiconductor material, which destroys the short circuit thyristor. The latter then forms a permanent short circuit. The contacting of this short circuit thyristor is designed to be short-circuit-proof in such a way that no arc can form in it due to the large short-circuit current. Among other things, press-contacting is proposed for this purpose.

DE 103 33 798 A1 also describes a method for short-circuiting a faulty partial converter in which current-carrying power semiconductor switches configured as IGBTs are turned on for a short time, in case of a failure, in such a way that they are shorted permanently. Various methods are proposed in order to ensure the semiconductor switches are shorted reliably: 1. raising the gate-emitter voltage of the power semiconductor switches; 2. turning on the power semiconductor switches and then turning them off rapidly at a large current; 3. turning the power semiconductor switches on extremely rapidly; and 4. turning them on and off several times.

Also, EP 3 001 525 A1 discloses a short-circuit switch with a semiconductor switch that can be controlled in order to short-circuit a voltage present between two conductors. The semiconductor switch is a conventional press-pack-type thyristor with planar contact electrodes on contact sides situated opposite one another. When the semiconductor component is mounted, its contact electrodes are contacted by means of planar connection electrodes which are resiliently pressed towards one another with high rigidity. In this way, the planar contacting of the semiconductor component is ensured by high flowing power currents even under high thermal stress. The thyristor is disposed in a mechanical press-pack structure forming a protective cover enveloping the thyristor. The thyristor is designed in such a way that, as a controllable semiconductor switch, it is irreversibly destroyed by a short-circuit current flowing though it during the short-circuiting, with the conductivity between its contact electrodes being maintained. The short-circuit current is supposed to be at least 50 times the rated current for which the thyristor is designed.

The use of a conventional thyristor as a short-circuit switch is disadvantageous in that it is not guaranteed at which current the thyristor is being destroyed and forms a defined short circuit, because the surge current value of a conventional thyristor varies to a great extent in the upward direction.

The realization of a "short-on-fail" state by targeted shorting, as described above, can be reliably ensured by a suitable module configuration, such as press-contacting, for example. In this case, the semiconductor component is located in a suitable housing, e.g. a ceramic cell or ceramic capsule, whose external current contacts, usually the cathode and anode connections, consist of thick copper stamps (or other conductive materials). A suitable pressure bond ensures that the two contact stamps are contacted with a sufficiently high pressure against the respective metallic contact electrodes of the semiconductor component in order to form a particularly low-level electrical and thermal transition between the semiconductor component and the copper stamps of the housing. If the location of the shorting is located within the pressed contact region, the area of destruction of the semiconductor component remains within the pressed contact surface, both during the case of failure, in which fusing and shorting occurs, and during the permanent current flow after the case of failure. Externally, the housing is not damaged or only to a small extent; the conversion of energy during and after the case of failure takes place within the semiconductor component and there remains limited to the press-contacted area. The point is that the electrical connection in the component is not interrupted by the case of failure, as may be the case in a solder bond component in which the current flows through bond wires. Here, a galvanic separation of the connections in the component occurs at high currents, due to a fusing of the bond wires or soldered connections. Because of the very high energy, this inevitably results in the complete destruction of the entire semiconductor component in a case of failure, which also constitutes a high level of danger to the installation in the vicinity of the component. The bond wires are relatively exposed within the housing surrounding the semiconductor component and are often also embedded in a gel, which is the reason for an explosive destruction due to an arc between the disconnected bond wires. In contrast, in the case of a press-contacted component, the energy conversion in the silicon or the fusing area or arc is limited within the area contacted by the anode-side and cathode-side contact disks, so that an explosion or destruction of the immediate vicinity of the component is largely avoided even at the highest current densities.

If a conventional thyristor is subjected to a load at its surge current limit, it partially or completely loses its blocking capacity for a short period of time, i.e. reversibly, due to the great large-scale heating of its cathode surface, until the blocking layer temperature has dropped back to the range permissible for continuous operation. The permissible surge current density at maximum current of a single 10 ms pulse which does not yet result in an irreversible destruction typically is between 1.0 and 1.5 kA/cm². If this limit is exceeded to a significant extent, the heating results in fused portions (shorting) within the cathode surface, the thyristor is destroyed and irreversibly loses its blocking capacity or controlling function. As long as the fused portions are located within the area contacted and pressed by the copper contact disks or copper stamps of the capsule and, at the same time, sufficiently distant from the edge region of the thyristor, both the capsule and the immediate vicinity remain largely intact.

However, a fundamental disadvantage of a conventional thyristor as a short-circuit device as described in DE 10 2008 049 678 A1 or DE 10 2009 045 216 A1 is its large cathode surface, which is designed for as small a conduction or forward loss as possible, or for maximum surge current capacity. Its diameter approximately corresponds to that of the contact disks of the copper stamp, or is regularly slightly larger (up to about 0.5 to 2 mm). If a high short-circuit current results in an intended shorting in the cathode surface, it is not ensured that that occurs sufficiently far away from the edge region of the thyristor. The radially outer region of the component that is not covered or pressed against by the contact discs of, for example, copper stamps, which usually press-contact the contact electrodes (particularly the cathode an anode connections) of the semiconductor component, may be considered the edge region. The shorted region is located somewhere within the cathode surface and may also extend into the edge region. In this case, a destruction of the ceramic housing and an escape of plasma may occur. Plasma could also escape in a center of the semiconductor component, for example if a gate electrode or an auxiliary thyristor structure (amplifying gate structure), which is also not covered or pressed against by the contact disks of the copper stamp press-contacting the semiconductor component, is disposed in the center of the semiconductor component.

Compared to the rest of the surface directly contacted or covered by the copper contact disks, the edge region of a thyristor is also much more susceptible to the occurrence of overvoltages. Such a failure, in conjunction with the short-circuit current that flows in that case, results in the destruction of the capsule due to the very high energy density, particularly at a high blocking voltage, as was already described above. Though the capacity to withstand such overvoltages could be improved considerably by various measures, this entails serious disadvantages. For example, a silicon starting wafer that is a lot thicker would significantly increase the blocking capacity, and thus, the probability of a failure at the edge caused by overvoltage could be largely avoided. However, due to the dynamic losses and forward losses in a conventional thyristor structure being too high in that case, this is not a viable possibility because the thyristor is then no longer able to satisfy the requirements placed on it, primarily very low forward losses and maximum surge current behavior as well as very low dynamic losses.

For example, if the thyristor fails while the blocking voltage $U_R$ is applied, e.g. due to an overvoltage or a blocking instability of the passivation of its edge contour, the location of failure is most frequently located in the edge region of the thyristor component, and thus outside the region directly contacted by the copper contact disks. A very high short-circuit current flows in the blocking direction, wherein the undisturbed region does not participate in the current flow, whereas fusing occurs at the failure location. An arc is generated inside the housing capsule or at the failure location, the fused material evaporates and hot plasma is generated, which, depending on the intensity, may result in the capsule being destroyed. Due to this explosive discharge, a rupture may occur in the vicinity of the fused portion in the ceramic capsule, from which hot plasma escapes in that case. Such an edge failure may also occur if a blocking voltage $U_D$ is applied.

Against this background, the present invention is based on the object of providing a short-circuit semiconductor component with which an electrical voltage applied to the semiconductor component can be reliably and permanently (with long-term stability) short-circuited in accordance with a triggering or turn-on signal, without plasma explosively escaping from the semiconductor component in the process. Furthermore, the semiconductor component is supposed to be capable, in the normal, non-short-circuited operational state, of blocking a current flow through it reliably and with long-term stability in both directions or polarities if an electrical voltage is applied thereto. Furthermore, the blocking losses in this case of operation are supposed to be so small that it can be operated without an active cooling system. Furthermore, a method for operating a short-circuit semiconductor component is to be provided.

This object is accomplished by a short-circuit semiconductor component having the features of claim 1 and a method for operating a short-circuit semiconductor component having the features of claim 21. Other particularly advantageous embodiments of the invention are disclosed by the dependent claims.

It must be noted that the features cited individually in the following description can be combined with each other in any technologically meaningful manner and represent other embodiments of the invention. The description, in particular in connection with the figures, additionally characterizes and specifies the invention.

According to the invention, a short-circuit semiconductor component comprises a semiconductor body, in which a rear-side base region of a first conduction type, e.g. of the p-type, an inner region of a second conduction type complementary to the first conduction type, e.g. of the n-type, and a front-side base region of the first conduction type are successively arranged in a vertical direction starting from a rear side with a rear-side center determined by its geometric center of gravity towards a front side, which is opposite to the rear side, with a front-side center determined by its geometric center of gravity. Furthermore, the rear-side base region is connected in an electrically conductive manner to a rear-side electrode (metallization, e.g. aluminum) with a lateral rear-side electrode width determined by its lateral extent, which is applied to the rear side. The front-side base region is connected in an electrically conductive manner to a front-side electrode (metallization, e.g. aluminum) with a lateral front-side electrode width determined by its lateral extent, which is applied to the front side. Moreover, according to the invention, at least one front-side turn-on structure with a lateral front-side turn-on structure width determined by its lateral extent is embedded in the front-side base region and at least partially covered by the front-side electrode and/or at least one rear-side turn-on structure with a lateral rear-side turn-on structure width determined by its lateral extent is embedded in the rear-side base region and at least partially covered by the rear-side electrode. In this case, the turn-on structure is configured and arranged in such a way that it is turned on depending on a predeterminable turn-on signal supplied to the semiconductor body and produces, on a one-off basis, a permanent, irreversible, electrically conductive, low-resistance connection between the front-side electrode and the rear-side electrode. The invention further provides that, if the front-side turn-on structure is present, the ratio of the lateral front-side turn-on structure width to the lateral front-side electrode width is less than 1 and that, if the rear-side turn-on structure is present, the ratio of the lateral rear-side turn-on structure width to the lateral rear-side electrode width is less than 1.

It is also noted that the conjunction "and/or" used hereinafter, which is placed between two features and links them to each other, should always be interpreted such that, in a first embodiment of the subject matter according to the invention, only the first feature may be provided, in a second embodiment of the subject matter according to the invention, only the second feature may be provided, and in a third embodiment of the subject matter according to the invention, both the first and the second feature may be provided.

Herein, a direction that is substantially perpendicular to the vertical extending direction of the semiconductor body is considered a lateral extending direction in the semiconductor body. Accordingly, in the case of a semiconductor body configured, for example, as a cylinder (with a low height), the vertical extending direction corresponds to the direction of the cylinder height, and the lateral direction corresponds to the radial direction of the cylinder. Herein, the terms lateral and radial are used synonymously.

Further, it is to be noted that the front-side center and the rear-side center of the short-circuit semiconductor component may differ from each other, which is not an absolute necessity, however, and which is also usually not the case. Usually, the two centers define an axis of symmetry of the semiconductor body, starting from which the radius of the semiconductor body is determined. If a center is mentioned in the following in relation to a front-side component of the short-circuit semiconductor component, then this center is always to be understood to be the front-side center unless expressly stated otherwise. Equally, a relation between a center and a rear-side component of the semiconductor body is analogously to be understood to be the rear-side center, unless expressly stated otherwise.

The lateral width of an overall structure, e.g. of a turn-on structure or electrode, is thus given by a distance of an inner side, which radially delimits the overall structure the farthest towards the inside, from an outer side, which radially delimits the overall structure the farthest towards the outside. This is immediately evident for structures of the semiconductor body that are spaced apart from their radial center (r=0), i.e. the geometrical center of gravity or center point of the front and/or rear side of the semiconductor body. In the special case that the overall structure has no distance from the radial center, i.e. extends with its radial inner side to the radial center, the lateral width of the overall structure corresponds to the distance of an outer side radially delimiting the overall structure towards the outside from the radial center. In other words, the lateral width in this case corresponds to the radius (measured from the radial center) of the overall structure, or also half its diameter.

Thus, the semiconductor body of the short-circuit semiconductor component according to the invention has, between its front-side electrode or front-side metallization and its rear-side electrode or rear-side metallization, a p-n-p or n-p-n structure which blocks the component reliably and with long-term stability in both directions or polarities for an electrical voltage present between the front-side electrode and the rear-side electrode. This state is herein referred to as a normal, non-short-circuited operational state of the short-circuit semiconductor component according to the invention.

However, if too high a current, which may amount to up to several 100 kA, causes an overload in case of an accident in an electrical installation to be protected by the short-circuit semiconductor component according to the invention, the short-circuit semiconductor component according to the invention is turned on on a one-off basis through the turn-on signal by means of the at least one turn-on structure, and is then permanently and irreversibly short-circuited between the outer metal connections, i.e. between the front-side and rear-side electrodes. Afterwards, the short-circuit semiconductor component according to the invention is no longer capable of blocking. This state is herein referred to as a short-circuited operational state or short-circuit state of the short-circuit semiconductor component according to the invention.

The turning on or activation of the turn-on structure as a consequence of feeding the predeterminable turn-on signal to the semiconductor body results, in a targeted manner, in the one-off formation of a permanent, irreversible, electrically conductive, low-resistance connection between the front-side electrode and the rear-side electrode (permanent short circuit).

In this case, the permanent short circuit is generated by the targeted turning-on process on a locally limited surface in the component, which is determined substantially by the respective ratio of the lateral front-side turn-on structure width to the lateral front-side electrode width (if a front-side turn-on structure is present in the semiconductor body) or of the lateral rear-side turn-on structure width to the lateral rear-side electrode width (if a rear-side turn-on structure is present in the semiconductor body), so that there, a subsequent fusing is the result in the current-carrying area, due to the high current density. In this process of fusing, which is also referred to as shorting, the materials of the outer metal connections (e.g. aluminum, molybdenum and/or copper) and the silicon of the semiconductor body fuse together. After the fusing process, a metallic zone with a high conductivity forms, which permanently short-circuits the outer metal connections and is also capable, in principle, of maintaining this short-circuit function under a current load over a longer period of time, e.g. until the next repair process.

In accordance with the above description, a method for operating a short-circuit semiconductor component which has the features of the invention described herein is also disclosed according to another aspect of the invention.

When considering the ratio between the lateral turn-on structure width and the respective lateral electrode width, then, according to the present invention, the lateral turn-on structure width of the front-side turn-on structure, provided that is present in the semiconductor body, is always compared with the lateral electrode width of the front-side electrode, and the lateral turn-on structure width of the rear-side turn-on structure, provided that is present in the semiconductor body, is always compared with the lateral electrode width of the rear-side electrode. Accordingly, reference is made herein to an association of the front-side turn-on structure with the front-side electrode and to an association of the rear-side turn-on structure with the rear-side electrode.

In the case of the accident, a turn-on signal is thus generated on a one-off basis with which the at least one front-side and/or rear-side turn-on structure is activated or turned on in such a way that an electrically conductive, low-resistance connection is established between the two outer electrical connections, i.e. between the front-side and rear-side electrodes, of the short-circuit semiconductor component according to the invention and the p-n-p or n-p-n structure disposed between these two electrodes. Current flows (short-circuit current) between the front-side and the rear-side electrodes. It was found that the current-carrying capacity of the front-side or rear-side turn-on structure is substantially determined by the respective ratio of their lateral turn-on structure width to the lateral electrode width of the front-side or rear-side electrode respectively associated therewith. Compared with a conventional thyristor, in which this ratio is substantially 1 in order to be able to realize a maximum surge current and minimal conduction losses, the current-carrying capacity of the front- and/or rear-side turn-on structure in the short-circuit semiconductor component according to the invention, due to the ratio of less than 1 respectively defined herein, is limited in such a defined manner that turning on the short-circuit semiconductor component according to the invention reliably results in its shorting. After shorting, the short-circuit semiconductor component is in a permanent, non-reversible, low-resistance current-carrying state between the front-side and the rear-side electrode, so that an electrical voltage present between these two electrodes can be short-circuited permanently and with long-term stability. In other words, the voltage drop between the front-side and the rear-side electrode of the short-circuit semiconductor component according to the invention in case of a short circuit is so low (low-resistance current-carrying state) that the electrical losses in the short-circuit semiconductor component according to the invention are low even in the case of a longer short-circuit operation, and that therefore, an active cooling system may advantageously be omitted.

In the sense of the present invention, the above condition "less than 1" must always be interpreted in such a way that production-related dimensional deviations between the respective lateral turn-on structure width and the lateral electrode width of the electrode respectively associated with the turn-on structure concerned, which are within the production tolerances defined for the respective production process of the short-circuit semiconductor component according to the invention, do not fall under the condition "less than 1" used herein. In other words, according to the definition, a ratio of a lateral turn-on structure width to a lateral electrode width of the respective electrode is to be considered to be "less than 1" in the sense of the present invention only if the size of the two compared lateral widths differs to such an extent that this difference in size cannot reliably be ascribed to the production-related tolerance deviations of the respective feature, but is the result of targeted actions.

It was found that, with a given vertical thickness of the inner semiconductor region of the semiconductor body, the fusing current is substantial proportional to the surface of the front-side and/or rear-side turn-on structure and can thus be set. In addition, the lateral turn-on structure width of the respective turn-on structure, which is (considerably) smaller compared to the lateral electrode width of the respective electrode, permits a local limiting of the shorting in the short-circuit semiconductor component in such a way that the extent of the shorting in the lateral or radial direction can be limited to substantially the surface of the front- and/or rear-side turn-on structures. Thus, the region of the shorting can be kept sufficiently distant in any case from an outer edge region of the short-circuit semiconductor component according to the invention. Accordingly, shorting takes place exclusively in the inner region of the short-circuit semiconductor component covered by the front-side and the rear-side electrode, so that, during short-circuit operation, no mechanical destruction of the short-circuit semiconductor component in its edge region occurs which could result in plasma escaping from the short-circuit semiconductor component and thus, in a destruction of a housing that may possibly surround the short-circuit semiconductor component.

It may also be remarked here that, for any observed point of the short-circuit semiconductor component according to the invention, it should apply that the ratio of the lateral front-side turn-on structure width to the lateral front-side electrode width is less than 1 or that the ratio of the lateral rear-side turn-on structure width to the lateral rear-side electrode width is less than 1. If the short-circuit semiconductor component according to the invention is configured, for example, as a cylinder with a perfectly rotationally symmetric configuration of the front-side and/or rear-side turn-on structure and the corresponding electrode (front-side and/or rear-side), then the observation of the above-defined ratio at exactly one arbitrary point on the short-circuit semiconductor component directly applies also to all other points on the short-circuit semiconductor component. However, if the lateral turn-on structure width and/or the lateral electrode width, in the cylindrical short-circuit semiconductor component chosen as an example, changes depending on the position observed along the circumference of the short-circuit semiconductor component, i.e. the short-circuit semiconductor component is not configured in a rotationally symmetric manner with respect to the observed turn-on structure and/or the electrode associated therewith, then the ratio of the lateral turn-on structure width to the lateral electrode width may also change depending on the observed circumferential position. However, according to the above definition, in the sense of the invention, it is to be less than 1 at any observed point on the short-circuit semiconductor component.

Moreover, it is to be understood that in the sense of the present invention, in a case in which a turn-on structure substantially has no constant turn-on structure width in the vertical direction, the largest turn-on structure width occurring in the vertical direction is to be considered the turn-on structure width to be used for the comparison in the consideration of the ratio between the turn-on structure width and the electrode width of the electrode correspondingly associated with the turn-on structure.

Particularly preferably, the ratio of the lateral turn-on structure width to the lateral electrode width of the front-side or rear-side electrode correspondingly associated with, in each case, the front-side or rear-side turn-on structure can be selected to be less than 4/5, e.g. also less than 3/4, 2/3, 1/2, 1/3, 1/4, 1/5. In the short-circuit semiconductor component according to the invention, the lateral turn-on structure width of the front-side or rear-side turn-on structure is thus chosen to be much smaller in any case than the lateral electrode width of the respective electrode. In this way, a fusing current reliably resulting in a shorting of the short-circuit semiconductor component according to the invention can be set to a value that is as small as desired. It is thus ensured that a relatively small fault or short-circuit current carried by the short-circuit semiconductor component according to the invention between the front-side electrode and the rear-side electrode reliably shorts the component in the desired manner and thus establishes the non-reversible, low-resistance current-carrying state (short-circuited operational state).

An advantageous embodiment of the invention provides that the turn-on structure is completely covered by the front-side electrode and the rear-side electrode, which is to be understood to mean a coverage in the lateral direction. The complete front-side and rear-side coverage of the at least one turn-on structure offers the advantage that the possibility of plasma escaping from the semiconductor body due to the shorting is reduced even further, because the shorting in the short-circuit semiconductor component according to the invention can substantially be locally limited in such a way that it occurs in the region covered by both electrodes, as was already explained above. As a result, a destruction of a housing possibly surrounding the short-circuit semiconductor component during the shorting is reliably prevented because an escape of plasma from the short-circuit semiconductor component is prevented in this manner. Preferably, the coverage of the respective turn-on structure by the front-side or rear-side electrode in the outer edge region (i.e. in the direction towards the radial outer edge of the short-circuit semiconductor component according to the invention) may be in the range of at least a few millimeters, e.g. about 1 mm to 5 mm or greater.

Moreover, the at least one turn-on structure may preferably be disposed close to the center in the semiconductor body. This is to be understood to mean that the radial distance of an inner side, which radially delimits the turn-on structure the farthest towards the inside, from the corresponding center of the semiconductor body, i.e. the geometrical center of gravity or center point of the front and/or rear side of the semiconductor body (herein also referred to as a radial center), is smaller than the distance from an outer side, which radially delimits the turn-on structure the farthest towards the outside, to a radial outer edge of the semiconductor body. This measure primarily also further reduces the possibility of plasma escaping during the shorting of the short-circuit semiconductor component according to the invention in the edge region of the semiconductor body, because the shorting is limited to a region of the semiconductor body close to the center between the front-side and the rear-side electrode, which is covered by those electrodes. A destruction of a housing possibly surrounding the short-circuit semiconductor component as a consequence of shorting is thus also reliably prevented.

Another advantageous embodiment of the invention provides that the front-side electrode and the rear-side electrode cover the front-side or rear-side center, respectively, of the semiconductor body, and the turn-on structure is disposed in this center. The distance of an outer side radially outwardly delimiting the turn-on structure from a radial outer edge of the semiconductor body can thus be maximized, and thus, the edge region of the semiconductor body and, additionally, the region between the radial outer side of the turn-on structure and the radial outer edge of the semiconductor body, depending on the selected lateral electrode width of the front-side and rear-side electrode which, according to the invention, is always greater than the lateral turn-on structure width, can be reliably protected, by means of the coverage of the front side and the rear side of the semiconductor component, against an unwanted escape of plasma due to the shorting of the short-circuit semiconductor component.

According to yet another advantageous embodiment of the invention, the turn-on structure is an emitter structure of the second conductive type, e.g. of the n-type, which is embedded into the front-side or rear-side base region and contacted in an electrically conductive manner to the electrode (front-side or rear-side electrode) applied to the respective base region, which can be turned on by means of at least one trigger structure which, via the semiconductor body, acts on it electrically. In this case, the trigger structure can in turn be activated by means of a turn-on signal. It is to be understood that an emitter structure contacted in an electrically conductive manner to the front-side electrode is a front-side turn-on structure, in which the emitter structure of the second conduction type is embedded into the front-side base region of the first conduction type so as to adjoin the front side of the semiconductor body, in such a way that it is contacted in an electrically conductive manner by applying the front-side electrode to the front side of the semiconductor body. This applies mutatis mutandis to an emitter structure contacted in an electrically conductive manner to the rear-side electrode, which, correspondingly, is a rear-side turn-on structure, in which the emitter structure of the second conduction type is embedded into the rear-side base region of the first conduction type so as to adjoin the rear side of the semiconductor body, in such a way that it is contacted in an electrically conductive manner by applying the rear-side electrode to the rear side of the semiconductor body. The emitter structure is in this case preferably contacted to the respective front-side or rear-side electrode by direct contact between the respective components.

The turn-on structure with a certain lateral turn-on structure width, which is formed as an emitter structure, is advantageous in that the current plasma can spread across the surface of the emitter structure before shorting starts, with the result that the shorting has a greater lateral width and thus a larger cross-section as a whole. The greater conduction cross-section of the shorted area in the semiconductor body obtained in this manner advantageously entails a reduction of the electrical resistance of the short-circuit region in the semiconductor body formed by the shorting. Accordingly, the short-circuit region is capable of carrying higher short-circuit currents with lower conduction losses. Advantageously, an active cooling system of the semiconductor component according to the invention can be omitted.

According to yet another advantageous embodiment of the invention, the trigger structure is a gate electrode, and the turn-on signal is an electrical signal supplied to the gate electrode. Particularly preferably, at least one region of the base region containing the emitter structure, which forms the operative electrical connection between the gate electrode and the emitter structure, may in this case be configured in such a way that an electrical signal supplied to the gate electrode with a current intensity of at least about 1 A, preferably at least about 2 A and more preferably between about 5 A and about 10 A can be used for turning on the emitter structure.

The trigger or turn-on current of a conventional thyristor depends on the specific sheet resistance of its cathode-side base region into which the cathode-side emitter is embedded, and, with respect to the process, has to be adjusted in such a way that the trigger or turn-on current values are typically within the mA range, particularly assume values of between 30 mA (125° C.) and 400 mA (room temperature) and, accordingly, lie within a relatively narrow range. It is thus ensured, for example, that conventional thyristors safely withstand the high turn-on loads when switching large currents with very high rates of rise of the current at the start of the turning-on process, if they are controlled by conventional trigger or turn-on current generators with precisely defined trigger or turn-on current curves (trigger or turn-on current amplitude and duration).

Because the short-circuit semiconductor component according to the invention is supposed to be shorted after being triggered once, a considerably higher minimum turn-on current is preferably chosen for the short-circuit semiconductor component, particularly in the ampere range, e.g. at least 1 A or at least 2 A, or even at least 5 A to about 10 A, because, on the one hand, the effort for inspecting the specific sheet resistance of the base region containing the emitter structure during the production of the short-circuit semiconductor component can thus be reduced considerably and, on the other hand, much lower requirements may be laid down for the trigger or turn-on current generators generating the electrical turn-on signal, so that less expensive control concepts are possible.

Moreover, it is to be understood that, despite the relatively high trigger or turn-on current selected in the inventive short-circuit semiconductor component according to this embodiment, the short-circuit semiconductor component according to the invention is still controlled only in a slightly overdriven manner, e.g. with an overdrive of 10 A/5 A=2. However, if a trigger or turn-on current is used in a conventional thyristor that is in the ampere range, e.g. in the range between 5 A and 10 A, instead of in the mA range as described above, this results in an overdriving of a conventional thyristor that is higher by one or two orders of magnitude, with an overdrive factor or, for example 10 A/100 mA=100. The large overdrive factor enables the conventional thyristor to turn on rapidly. In the short-circuit semiconductor component according to the invention, an overdrive that is selected to be weak (with, however, a large trigger or turn-on current in the ampere range) promotes the desired failure of the component, i.e. the desired one-off, irreversible shorting.

Furthermore, a large turn-on current yields further advantages. For example, a simple detection mechanism can be provided for checking the readiness of the short-circuit semiconductor component by means of a permanent test current between the connections of the gate electrode and the electrode contacting the emitter structure to be turned on by the gate electrode (front-side or rear-side electrode), wherein the test current is in that case selected to be very much smaller than the turn-on current. Moreover, a large turn-on current also offers a higher level of EMC protection, e.g. with respect to false triggering caused by rapid changes of very high voltages and currents in the vicinity of the short-circuit semiconductor component, since the susceptibility to such false triggering processes increases with a decreasing trigger or turn-on current.

In addition to the above-described turn-on current intensities, turn-on current much smaller than 1 A can be set in the short-circuit semiconductor component according to the invention in special cases, e.g. turn-on current intensities of less than 1 A down to about 500 mA, or even less, down to about 100 mA.

Another advantageous embodiment of the invention provides that the trigger structure is a photosensitive portion disposed in the base region containing the emitter structure, and the turn-on signal is an optical signal supplied to this photosensitive portion. Lasers or less expensive LEDs are suitable light sources, for example. The advantage of the optical turn-on signal over an electrical turn-on signal is a better EMC protection because an optical feed of the turn-on signal to the photosensitive trigger structure in the semiconductor body (e.g. via a glass fiber), compared with the electrical feed, is completely unsusceptible with respect to a false triggering caused by very strong electrical and magnetic fields due to very large current and voltage changes in the vicinity of the short-circuit semiconductor component. Moreover, an optical turn-on signal offers advantages in the case of large differences in potential present at the short-circuit semiconductor component (insulation against very large voltage differences in the 10 kV to 100 kV range).

Furthermore, turning on the short-circuit semiconductor component by means of the optical turn-on signal carried out on a one-off basis in the case of failure offers further advantages compared with a conventional light-triggered thyristor. Since the optical turn-on signal is generated only on a one-off basis in case of a failure in the short-circuit semiconductor component according to the invention, there are no particular requirements with regard to an ageing of the optical control unit, as is the case for a laser, for example, if the latter has to provide a signal of sufficient strength periodically, over a period of several decades. Therefore, minimum triggering powers are not required. Instead of a laser, a considerably less expensive LED may advantageously be used as an optical control unit. Compared to a conventional light-triggered thyristor, further integrated protective functions may be omitted, such as a BOD protection (BOD: Break Over Diode) or a du/dt protection, which permits a simpler gate design. A considerable simplification of the optical control unit including a light guide system is thus possible in comparison with conventional optical control units.

According to another advantageous embodiment of the invention, the trigger structure is a breakdown structure, and the turn-on signal is the electrical voltage present between the front-side electrode and the rear-side electrode. The breakdown structure is characterized in that, depending on the electrical voltage applied to the outer electrodes of the short-circuit semiconductor component, which causes a corresponding voltage drop across the breakdown structure, it permits, upon reaching or exceeding a breakdown voltage determinable for the breakdown structure, a steep rise in current in the form of an avalanche current preferably not limited by a protective resistance, through which the emitter structure (turn-on structure), which is electrically operatively connected to the breakdown structure configured as a trigger structure, can be turned on.

For example, the breakdown structure may be configured as a BOD structure (BOD: Break Over Diode). Other breakdown structures, which functionally act in a similar way and which are known per se from conventional light-triggered thyristors (LTTs), can also be used, e.g. a breakdown structure having a common du/dt protection and/or a breakdown structure including a common circuit-commutated turn-off time protection with a local increase of carrier lifetime. Furthermore, the breakdown structure constitutes a further measure for avoiding a blocking failure in a radially outer edge region of the short-circuit semiconductor component in the case of an unpredictable overvoltage. In this case, the level of the breakdown voltage of the breakdown structure is adjusted in such a way that it assumes its lowest value of the entire semiconductor body precisely at the location of the breakdown structure and thus reliably prevents a breakdown in the edge region. For this purpose, the breakdown structure is disposed in the semiconductor body so as to be far away from the edge, in particular close to the center. For example, the breakdown structure may be configured in the form of a circumferentially closed structure which surrounds the center but is (slightly) spaced apart therefrom, such as an ring and/or polygon structure. In other cases, however, it may also be disposed directly in the center of the semiconductor body. Herein, the circumferential direction is to be understood to be an extending direction parallel to the front side or the rear side of the semiconductor body and substantially perpendicular to the radial or lateral direction of the semiconductor body.

Yet another advantageous embodiment of the invention provides that an amplifying gate structure with at least one amplifying gate is disposed in the base region containing the emitter structure between the trigger structure and the emitter structure electrically operatively connected therewith.

Particularly if a trigger structure configured as a breakdown structure is present, the at least one amplifying gate stage (herein also referred to as an AG stage) offers the fundamental advantage of largely limiting or reducing a temperature dependence of the level of the breakdown voltage of the breakdown structure, particularly of a BOD structure, in the semiconductor body and, associated therewith, also the level of the current density of the blocking current that is supposed to result in the turn-on structure being turned on and, ultimately, in the shorting of the short-circuit semiconductor component, as well as the dependence of the level of the breakdown voltage on the specific resistance, i.e. the dopant concentration, of the semiconductor material surrounding the breakdown structure, because one or several AG stages are capable of at least partially compensating the temperature-dependent behavior of the breakdown structure, e.g. of a BOD structure. Upon breakdown of the breakdown structure when the breakdown voltage is reached or exceeded, the breakdown current (avalanche current) serves as a turn-on signal for the at least one amplifying gate, which in turn results in possible downstream further amplifying gate stages being turned on, and ultimately in the actual turn-on structure being turned on.

In an embodiment of the invention that is particularly convenient to manufacture as regards its construction, a turn-on structure, which, for example due to a trigger structure disposed in the center of the semiconductor body, is disposed so as to surround this center and the trigger structure, spacing them apart, has a closed circumference. For example, the turn-on structure may be configured as a closed ring and/or polygon structure. Herein, the circumferential direction is to be understood to be the extending direction of the turn-on structure parallel to the front side or the rear side of the semiconductor body and substantially perpendicular to the radial or lateral direction of the semiconductor body.

According to yet another advantageous embodiment of the invention, the turn-on structure is spaced apart in the radial direction from the trigger structure and has at least one turn-on structure segment with a circumferential turn-on structure width, which is open in a circumferential direction of the semiconductor body. In other words, the turn-on structure in this exemplary embodiment is not circumferentially closed, as is the case, for example, in a closed ring and/or polygon structure. This means that the circumferential turn-on structure width of the at least one turn-on structure segment is smaller in any case than a circumferential turn-on structure width, which would correspond to a closed ring and/or polygon structure of the turn-on structure, and thus to a circumferential angle of the closed ring and/or polygonal turn-on structure of 360 degrees. Since a turn-on structure with a circumferentially closed polygon and/or ring structure, which is radially spaced apart from the center of the semiconductor body, has a certain minimum surface resulting from the production process because the lateral turn-on structure width, with respect to the process, cannot be manufactured to have less than a certain lateral minimum structure width, for example, which may be at least about 50 μm, for example, the surface of the turn-on structure that is effective in the fusing of the semiconductor body can be reduced still further by means of the present advantageous embodiment of the short-circuit semiconductor component according to the invention, whereby particularly small fusing currents resulting in the reliable shorting of the semiconductor body can also be realized. Accordingly, it would be possible, for example, to provide a minimal, single turn-on structure segment with a lateral turn-on structure width of about 50 μm and a circumferential turn-on structure width, i.e. a circumferential length, of also about 50 μm in the semiconductor body, which permits the design of a short-circuit semiconductor component according to the invention with a fusing current in the order of magnitude of a few mA.

According to yet another advantageous embodiment of the invention, at least two turn-on structure segments that are separate from each other are provided in the circumferential direction of the semiconductor body. Preferably, they are equidistantly spaced apart in order to obtain a substantially circumferentially symmetrical configuration of the short-circuit semiconductor component, which causes a more uniform current distribution in the semiconductor body both of the turn-on current for turning on the turn-on structure and of the fusing current for producing the shorting in the semiconductor body, and thus a more uniform heat distribution, particularly during shorting, over the entire semiconductor body, i.e. a more uniformly distributed mechanical load.

Yet another advantageous embodiment of the invention provides that the electrical resistance in the base region containing the turn-on structure is increased at least in a portion of the radial interspace between the turn-on structure and the trigger structure (herein also referred to as the resistance region of the base region) with the exception of at least one forward channel electrically coupling the at least one of the turn-on structure segments with the trigger structure. As a result, the turn-on current flowing from the trigger structure to the turn-on structure can be directed in a targeted manner to the single turn-on structure segment, in order to reliably turn on the latter if required, for initializing the shorting of the short-circuit semiconductor component according to the invention. By means of the turn-on current, which is directed in a targeted manner on to the at least one turn-on structure segment by means of the on-state channel, the overall turn-on current, which is required for turning on the or all turn-on structure segments and is provided by the trigger structure, can advantageously be additionally reduced compared to a turn-on current distribution that would otherwise extend homogenously in all radial directions.

An increased resistance in the resistance region of the base region compared with the resistance value in the on-state channel is supposed to be understood to be such a difference in size of the resistances that safely cannot be ascribed to the production-related dimensional deviations of commonly accepted manufacturing tolerances, but is the result of targeted actions. For example, the resistance in the resistance region may thus be increased in a targeted manner by a concentration of the charge carriers of the same conduction type as that of the rest of the base region that is considerably smaller compared with the rest of the base region, and/or by introducing into the resistance region of the base region a so-called pinch resistor of a conduction type complementary to the base region conduction type, whereby the resistance in the resistance region of the base region is also increased in a targeted manner due to a reduction of the effective conduction cross-section.

Another advantageous embodiment of the invention provides that the turn-on structure is a breakdown structure, and the turn-on signal is the electrical voltage present between the front-side electrode and the rear-side electrode. As was already explained above in connection with the breakdown structure configured as a trigger structure, the breakdown structure configured as a turn-on structure is also characterized in that, depending on the electrical voltage applied to the outer electrodes of the short-circuit semiconductor component, which causes a corresponding voltage drop across the breakdown structure, it permits, upon reaching or exceeding a breakdown voltage determinable for the breakdown structure, a steep rise in current in the form of an avalanche current preferably not limited by a protective resistance, through which desired shorting of the short-circuit semiconductor component is caused.

The breakdown structure configured as a turn-on structure may also be configured as a BOD structure (BOD: Break Over Diode). Other breakdown structures, which functionally act in a similar way and which are known per se from conventional light-triggered thyristors (LTTs), can also be used, e.g. a breakdown structure having a common du/dt protection and/or a breakdown structure including a common circuit-commutated turn-off time protection with a local increase of carrier lifetime. Furthermore, the breakdown structure constitutes a further measure for avoiding a blocking failure in a radially outer edge region of the short-circuit semiconductor component in the case of an unpredictable overvoltage. In this case, the level of the breakdown voltage of the breakdown structure is adjusted in such a way that it assumes its lowest value of the entire semiconductor body precisely at the location of the breakdown structure and thus reliably prevents a breakdown in the edge region. For this purpose, the breakdown structure is disposed in the semiconductor body so as to be far away from the edge, in particular close to the center. For example, the breakdown structure may be configured in the form of a circumferentially closed structure which surrounds the center but is (slightly) spaced apart therefrom, such as an ring and/or polygon structure. In other cases, however, it may also be disposed directly in the center of the semiconductor body, e.g. in such cases in which at least the center both on the front side and on the rear side of the short-circuit semiconductor component according to the invention is covered by the respective electrode, as was already described above in connection with a configuration of the short-circuit semiconductor component according to the invention.

Since a breakdown structure configured, as described above, as a trigger structure or turn-on structure draws its turn-on signal from the electrical voltage applied to the outer two electrodes of the semiconductor body, and thus no further external, e.g. optical or electrical, turn-on signal has to be supplied to the short-circuit semiconductor component if the turn-on structure or the trigger structure associated with a turn-on structure is only configured as a breakdown structure, then a diode housing that has no additional connection for an additional external turn-on signal can be used, particularly advantageously, for accommodating a short-circuit semiconductor component configured in this manner. In such a case, the breakdown structure may particularly preferably be disposed in the center of the semiconductor body, wherein the front- and rear-side electrodes may extend completely across the center and thus across the turn-on structure, because no recess for supplying the external turn-on signal need be provided.

According to another advantageous embodiment of the invention, the turn-on structure has at least one turn-on structure finger extending radially outwards from the rest of the turn-on structure in the lateral direction (also referred to as a finger structure of the turn-on structure). In other words, the at least one turn-on structure finger protrudes radially outwards from the rest of the turn-on structure. As was already explained above, the minimal fusing current integral at which the shorting of the short-circuit semiconductor component is supposed to occur is substantially determined by the lateral turn-on structure width of the respective turn-on structure, e.g. by a lateral turn-on structure width of an emitter structure or a lateral breakdown structure width of a breakdown structure, and equivalently, by the surface of the turn-on structure that is effective during the fusing of the semiconductor body. In other words, the small ratio, which is intended according to the invention, of the lateral turn-on structure width of the corresponding turn-on structure to the lateral electrode width of the associated electrode applied to the base region including the turn-on structure, causes a fusing current which is as small as desired and which reliably results in a shorting of the short-circuit semiconductor component, so that a relatively small fault or short-circuit current carried by the short-circuit semiconductor component between the front-side and the rear-side electrodes reliably shorts the short-circuit semiconductor component in the desired manner and thus establishes the non-reversible, low-resistance current-carrying state (short-circuited operational state).

On the other hand, the effective surface of the turn-on structure, e.g. of an emitter structure or a breakdown structure, and thus also the entire surface of the semiconductor body should generally be adapted to the strength of the short-circuit current to be permanently absorbed by the short-circuit semiconductor component in case of a short circuit, in order to prevent, if the surface of the turn-on structure is too small, an explosive start of the fusing process right at the beginning of the flow of the current, resulting in a mechanical destruction of the entire short-circuit semiconductor component, which would constitute a risk to the surroundings. A larger surface of the turn-on structure may have a favorable effect on the size of the lateral extent of the shorted region, wherein a laterally wider extent of the shorted region, due to a greater resulting conduction cross-section, advantageously entails a reduction of the electrical resistance of the short-circuit region in the semiconductor body formed by the shorting. The finger structure of the turn-on structure advantageously permits a compromise to be made between the contrasting demands for a surface of the turn-on structure that is as small as possible in order to reduce the short-circuit or fusing current required for reliable shorting, and a sufficiently large surface for safely carrying the short-circuit current without having to take the risk of a mechanical destruction of the short-circuit semiconductor component, because in the case of the fingered turn-on structure, the current-carrying region of the short-circuit semiconductor component turned on by the turn-on signal is able to spread over a greater circumference.

Moreover, the finger structure helps keeping the fusing region away from the center of the short-circuit semiconductor component. This is advantageous particularly if a trigger structure supplied with an external turn-on signal (e.g. optically or electrically) for turning on the turn-on structure or the short-circuit semiconductor component is located in the center of the semiconductor body. In such a case, the region in which the turn-on signal is supplied to the trigger structure is not covered by the electrode (e.g. cathode or anode electrode) which provides the electrical main connection for the short-circuit semiconductor component and which is applied to the base region having the turn-on structure, so that plasma could escape during shorting from the region of the non-covered front and/or rear side, and could consequently lead to the housing surrounding the short-circuit semiconductor component being damaged, thus endangering the surroundings.

Another advantageous embodiment of the invention provides that, if at least one trigger structure and a turn-on structure with a finger structure as described above are provided, the trigger structure has at least one trigger structure finger, which corresponds to or follows the contour or shape of the at least one turn-on structure finger. A uniform distance, e.g. in the lateral or radial direction and/or in the vertical direction, between the trigger structure and the turn-on structure can thus be ensured over the entire extent of the fingered turn-on structure, so that the trigger structure can act, in the sense of the invention, on the turn-on structure in a uniform manner over the entire extent thereof.

According to another preferred embodiment of the invention, the at least one turn-on structure finger has a maximum lateral, i.e. radial, finger length which is smaller than 4/5 of the lateral electrode width of the electrode applied to the base region having the turn-on structure. Thus, the maximum radial finger length may also be less than 3/4, 2/3, 1/2, 1/3, 1/4, 1/5 of the lateral electrode width, for example. If a trigger structure is provided which also has a finger structure and, as described above, corresponds to or follows the finger structure of the turn-on structure, the at least one trigger structure finger may also have a finger length corresponding to the finger length of the respective turn-on structure finger.

According to yet another advantageous embodiment of the invention, a thickness of the inner region in the vertical direction is greater than 400 μm, more preferably greater than 600 μm, and still more preferably greater than 800 μm or 900 μm, or even 1000 μm. In general, it is found that the danger of an edge failure of the short-circuit semiconductor component in the case of an overvoltage can be avoided by means of an inner region of the semiconductor body that is much thicker compared with a conventional thyristor. There is practically no maximum thickness for the inner region, as is the case in a conventional thyristor, because there are no conduction or dynamic losses for the short-circuit semiconductor component according to the invention that set an upper limit to the thickness of the inner region. For a required voltage class of, for example $V_{DRM}/V_{RRM}$=2.2 kV, a conventional thyristor having a thickness of $W_{n1}$ in the range of about 320 μm and a specific silicon resistance of 85 Ω·cm would have to be used. In contrast, a thickness $W_n$ of about 850 μm may be selected for the short-circuit semiconductor component of the present invention. A specific resistance 270 Ω·cm would result in more than double the symmetrical blocking capacity ($V_{DRM}/V_{RRM}$=5.2 kV) for the semiconductor structure of the semiconductor body according to the invention. Even blocking capacities >10 kV (medium-voltage grids) are possible given a corresponding design of the thickness of the inner region. Together with a setting for the lifetime by means of a high irradiation dosage for the electron irradiation, the blocking current may be adjusted to be very small. Thus, the blocking capability of the short-circuit semiconductor component may be set to be very much higher than the maximum overvoltage occurring during use of the short-circuit semiconductor component, and this without any disadvantageous effects both on the short-circuit semiconductor component and its application. As small a blocking current as possible is of great advantage for the short-circuit semiconductor component according to the invention because blocking voltage is virtually permanently applied to it in use, so that blocking currents that are as small as possible can be obtained and accompanying blocking losses can be kept as small as possible, so that the short-circuit semiconductor component can be operated without an active cooling system. The occurrence of a failure in the edge region of the short-circuit semiconductor component, which is critical with respect to the housing breaking current, is also substantially eliminated by means of this measure.

According to yet another advantageous embodiment of the invention, the front-side electrode and the rear-side electrode are each press-contacted in an electrically conductive manner by means of a metallic contact disk. In this case, the respective contact disk may preferably have the same lateral width as the corresponding electrode, so that the contact disk covers the corresponding electrode completely. The contact disks may be firmly connected to the corresponding metal electrode of the semiconductor body, e.g. by means of an alloy, or only rest thereon loosely. The contact disks may be configured as pure molybdenum disks or consist of a combination of a molybdenum and a copper disk, wherein molybdenum is preferably in direct contact with the semiconductor body metallization. Advantageously, the present invention ensures, as described above, that the region of the shorting produced between the front-side and the rear-side electrode of the short-circuit semiconductor component in the case of a short circuit is always located in the region of the short-circuit semiconductor component press-contacted by the metallic contact disks.

The thickness of the molybdenum disk or the combination of molybdenum and copper is preferably between 1 mm and 5 mm. In this case, it is to be understood that the thickness of the contact disks can be adapted to the strength of the short-circuit current flowing through the short-circuit semiconductor component. During shorting in the case of a short circuit operation, the silicon of the semiconductor body and the metal regions of the contact disks fuse together in such a way that a metallic zone is formed. Depending on the case of application or the strength of the maximum short-circuit current to be permanently conducted, the thickness of the contact disks is designed in such a way that the sides of the contact disks facing away from the respective electrodes of the semiconductor body substantially exhibit no all-too great change subsequent to the occurrence of fused portions. In particular, a press-contact, which ensures an electrically conductive, low-resistance and thermal coupling, is to be maintained, in the case of a short-circuit operation of the short-circuit semiconductor component, between the contact disks contacting the metallizations of the semiconductor body and respective contact stamps, e.g. copper stamps, of a housing accommodating the short-circuit semiconductor component, which are pressed against the contact disks with a sufficient surface pressure, so that the generation of an arc outside the region press-contacted by the contact disks after the short-circuit semiconductor component is triggered is reliably prevented. In no case is the fusing region supposed to escape through the (copper) contact stamps to the outside during the shorting.

It is to be understood that the above-described different types of turn-on structures may be combined in any way within a single short-circuit semiconductor component according to the invention, particularly if more than one turn-on structure is provided in the short-circuit semiconductor component. Mutatis mutandis, the above-described different types of trigger structures can also be combined with each other in a single short-circuit semiconductor component according to the invention, if more than one trigger structure is provided in the short-circuit semiconductor component. The above-described different types of trigger structures can also be combined with the different types of turn-on structures in any way.

Thus, the short-circuit semiconductor component according to the invention can be turned on, for example, both by means of one or several electrical turn-on signals and by one or more optical turn-on signals, with corresponding turn-on structures being provided in the semiconductor body. The turn-on signals may be supplied to the short-circuit semiconductor component only on one side, e.g. on the front side of the semiconductor body, or also on both sides, i.e. on the front and rear sides of the semiconductor body, with corresponding trigger structures being provided on the respective sides of the semiconductor body.

Furthermore, the short-circuit semiconductor component according to the invention may include one or several breakdown structures as trigger structures or turn-on structures, wherein several existent breakdown structures may be designed for the same or respectively different breakdown voltages.

The breakdown structures serving as a trigger structure, e.g. a BOD structure, but also a breakdown structure having a du/dt protection, and a breakdown structure with a circuit-commutated turn-off time protection with a local increase of carrier lifetime, may be arranged within an amplifying gate structure, i.e. laterally spaced from the front- or rear-side electrode and, accordingly, outside a region electrically contacted by these electrodes. The arrangement within an amplifying gate structure is not an absolute necessity, however. The breakdown structures serving as both trigger structure and turn-on structure may also be disposed vertically underneath the front- or rear-side electrode, e.g. in the base region electrically contacted by the respective electrode.

Moreover, the trigger and turn-on structures described herein can be provided only on one side, i.e. only in the front-side or the rear-side base region, or also on both sides, i.e. in both base regions of the semiconductor body of the short-circuit semiconductor component according to the invention.

In summary, the definitions of terms used herein are listed below in an overview:
I. Turn-on structure:
   A structure for generating a shorting in the semiconductor body of the short-circuit semiconductor component according to the invention, in order to establish, subsequent to it being turned on, a low-resistance electrically conductive state (short circuit) between the external electrical main connections (cathode/anode), which are electrically connected to the short-circuit semiconductor component and, in case of normal operation (non-short circuit), are electrically separated from each other by the semiconductor body.
   Possible embodiment as:
      a. Emitter structure
      b. Breakdown structure (e.g. in the form of a BOD, du/dt, circuit-commutated turn-off time protection structure)
II. Turn-on signal:
   Signal for initiating the turning on of a turn-on structure.
   Possible embodiment as:
      a. Separate electrical signal externally supplied to the short circuit semiconductor body according to the invention
      b. Separate optical signal externally supplied to the short circuit semiconductor body according to the invention
      c. Electrical voltage/operating voltage applied to the electrical main connections (cathode/anode) of the short-circuit semiconductor component according to the invention
III. Turn-on current:
   A current obtained from the turn-on signal and supplied to a turn-on structure configured as an emitter structure for triggering or turning on the former.
IV. Fusing current:
   A current causing a shorting in the semiconductor body.
V. Trigger structure:
   Optional auxiliary structure for forwarding to a turn-on structure the turn-on signal, which is always supplied to the auxiliary structure.
   Possible embodiment as:
      a. Gate electrode—Supplied turn-on signal: II.a
      b. Photosensitive semiconductor region (optical gate)—Supplied turn-on signal: II.b
      c. Breakdown structure (e.g. in the form of a BOD, du/dt, circuit-commutated turn-off time protection structure)—Supplied turn-on signal: II.b
VI. Amplifying gate structure (AG structure):
   Optional auxiliary structure disposed between a trigger structure and a turn-on structure for amplifying the turn-on signal coupled into the short-circuit semiconductor component according to the invention via the trigger structure.

Figure 2:
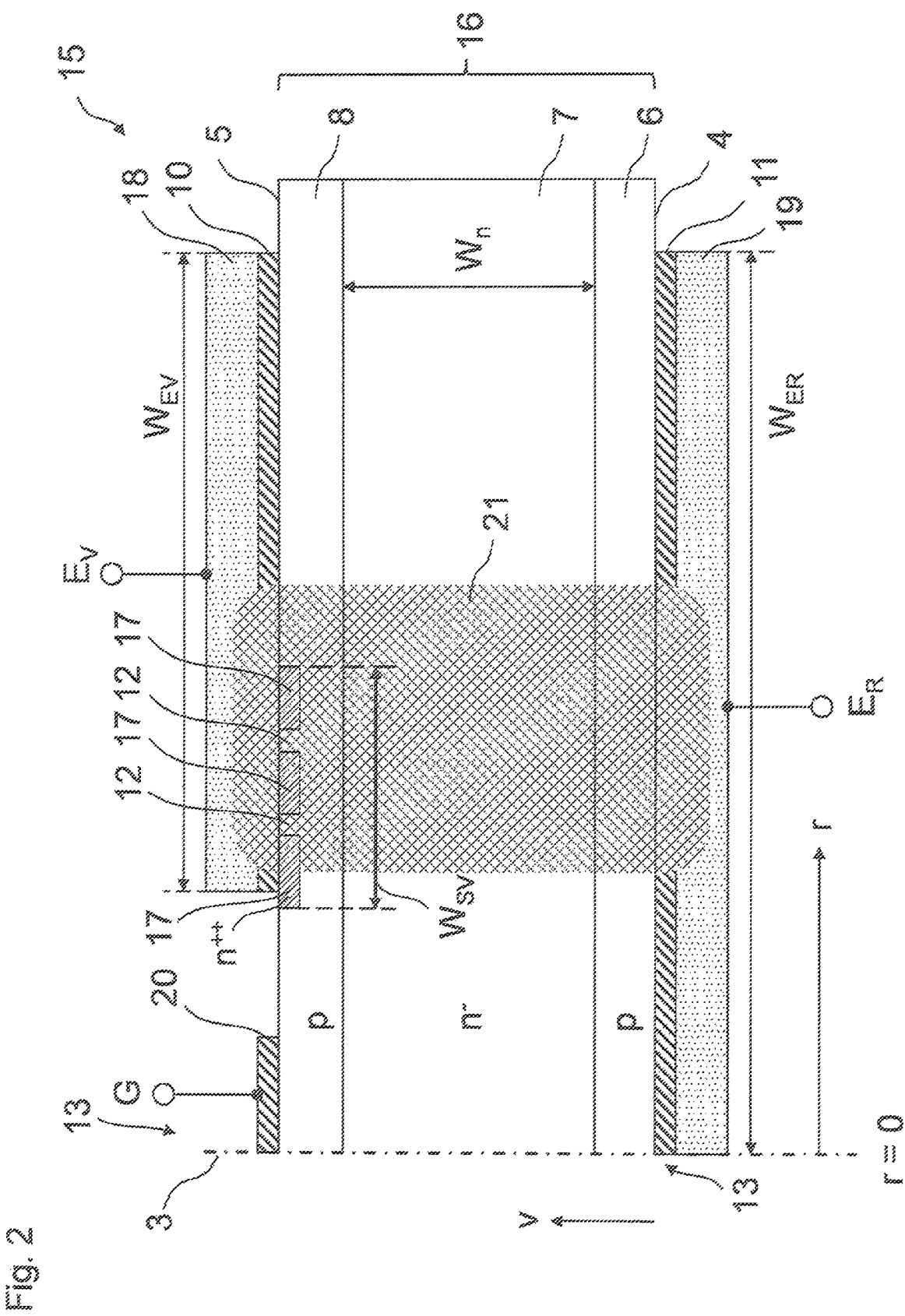
Figure 3:
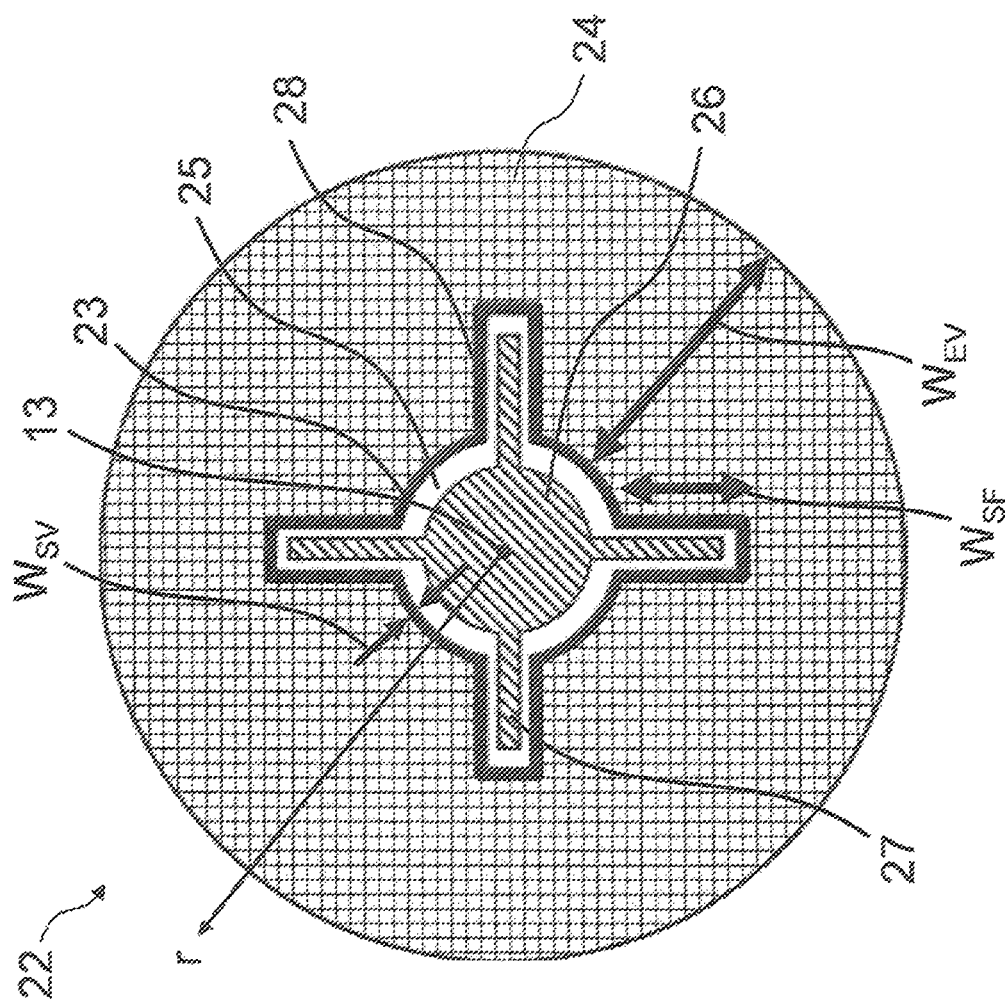
Figure 4:
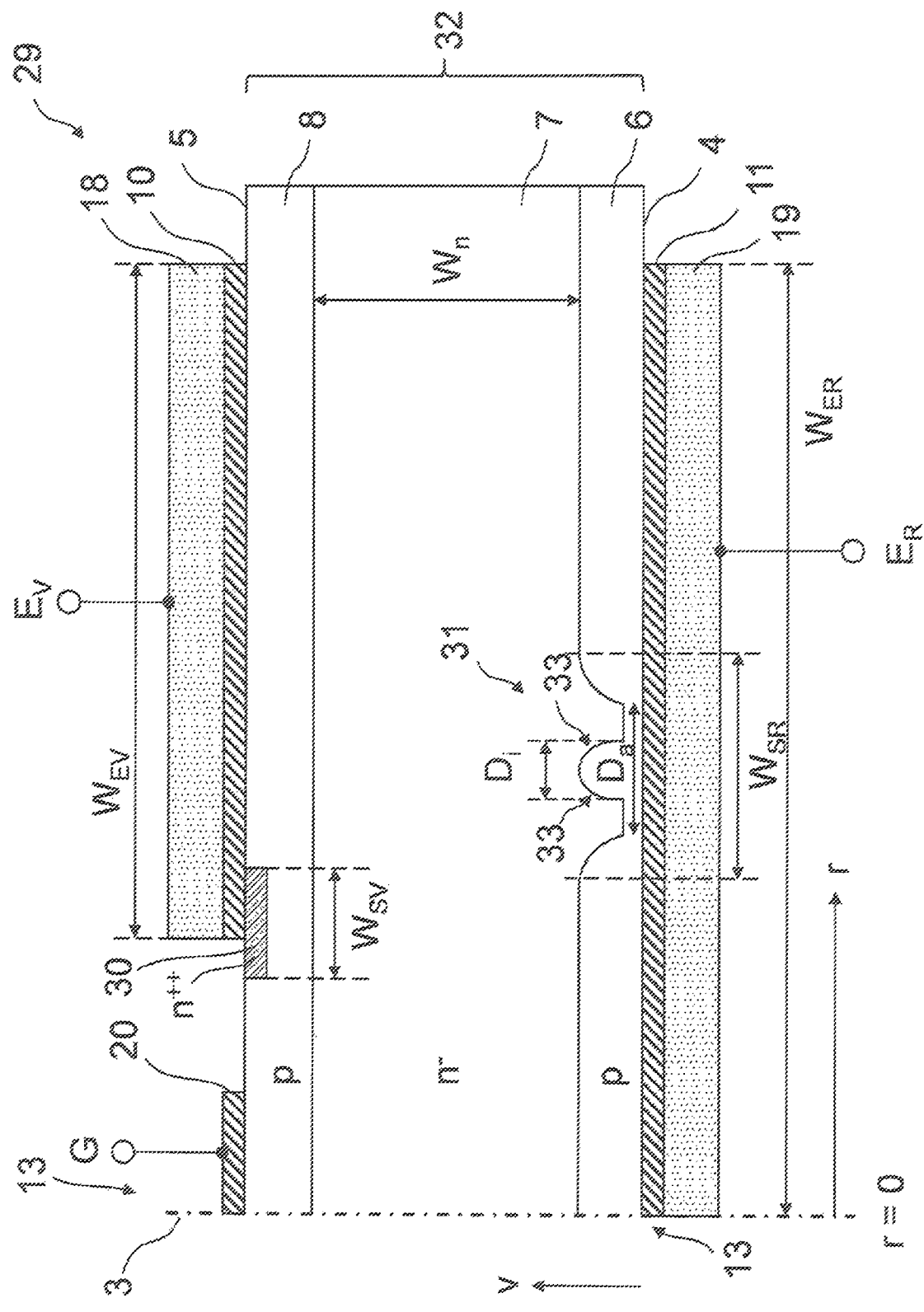
Figure 5:
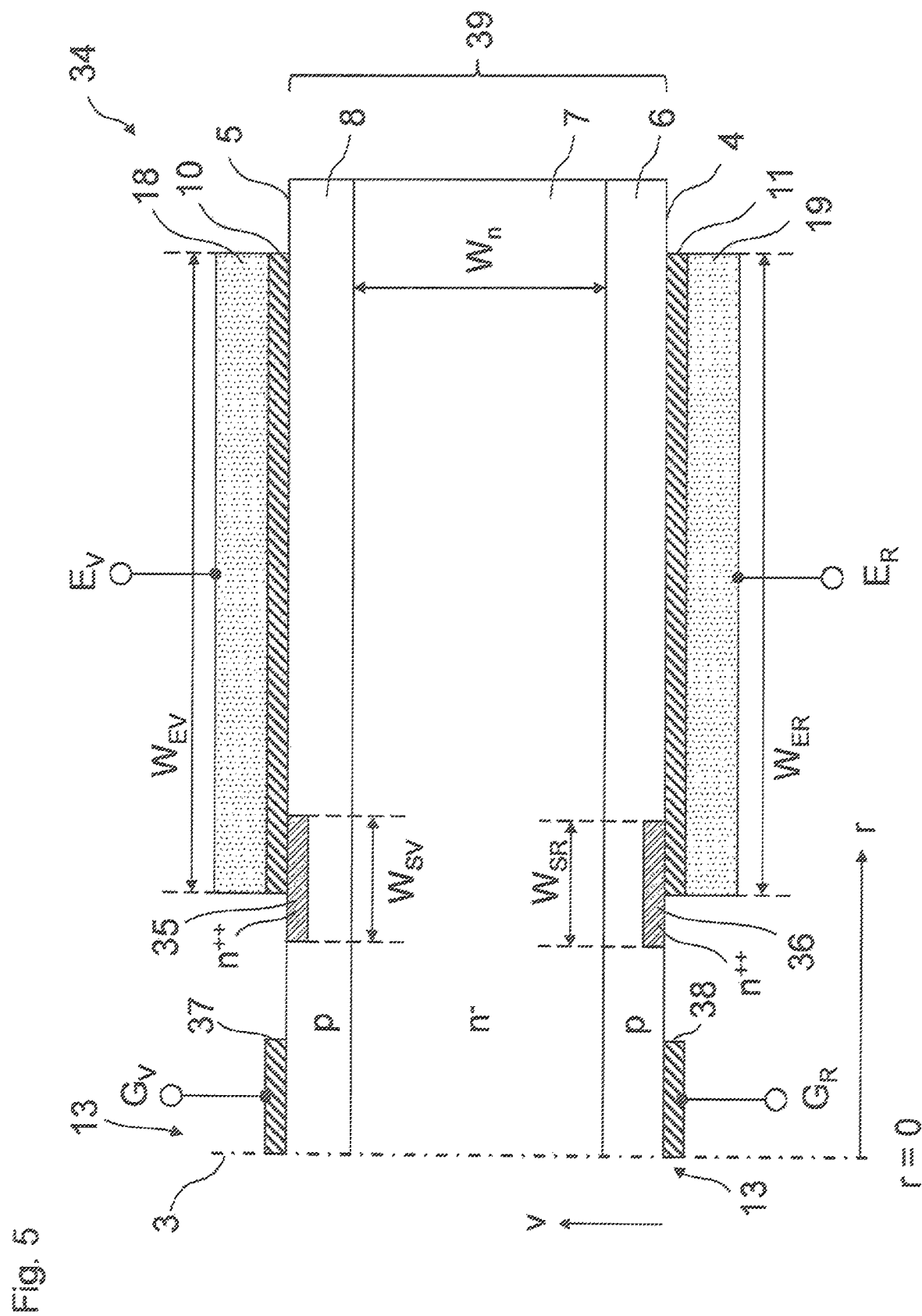
Figure 6:
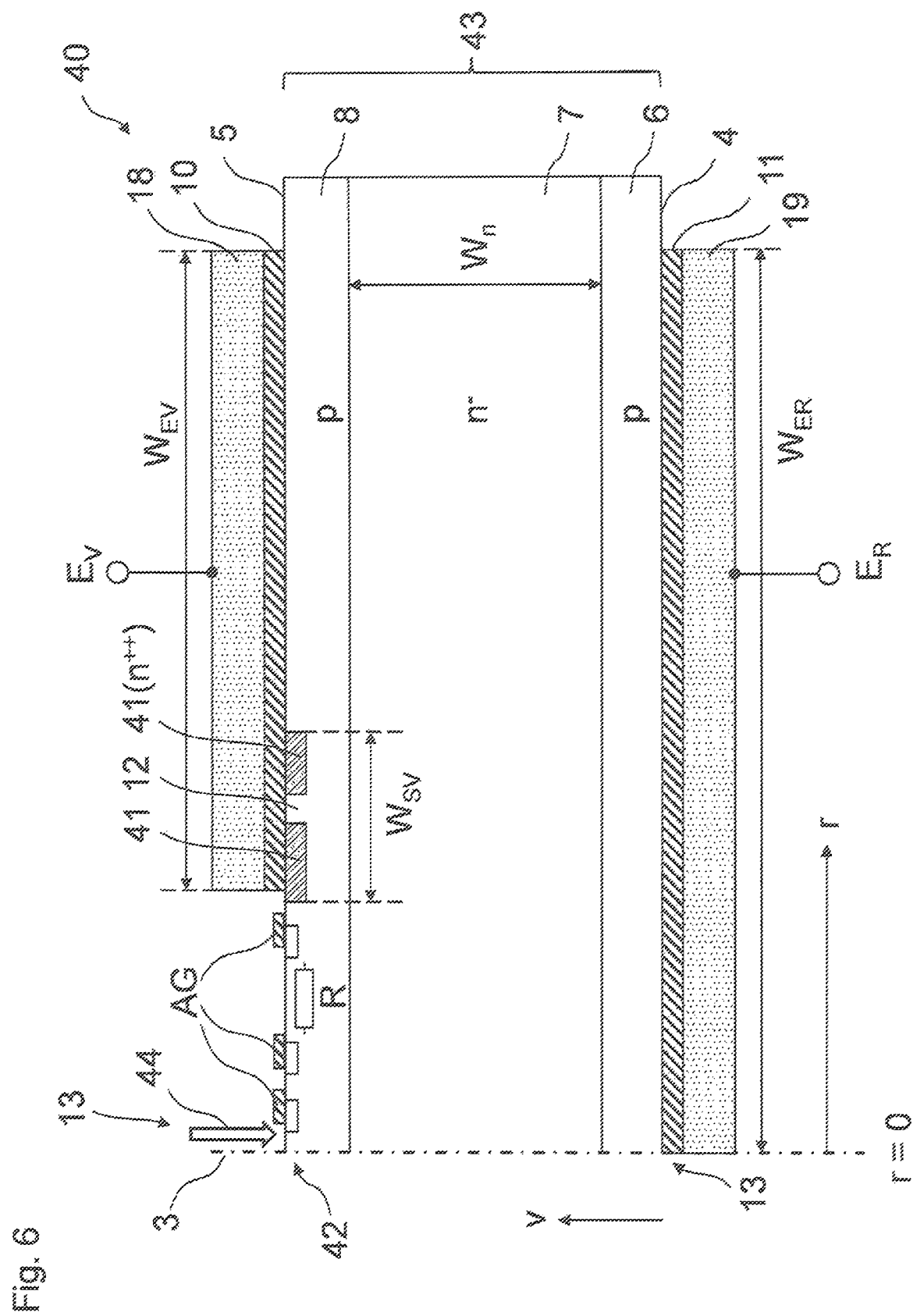
Figure 7:
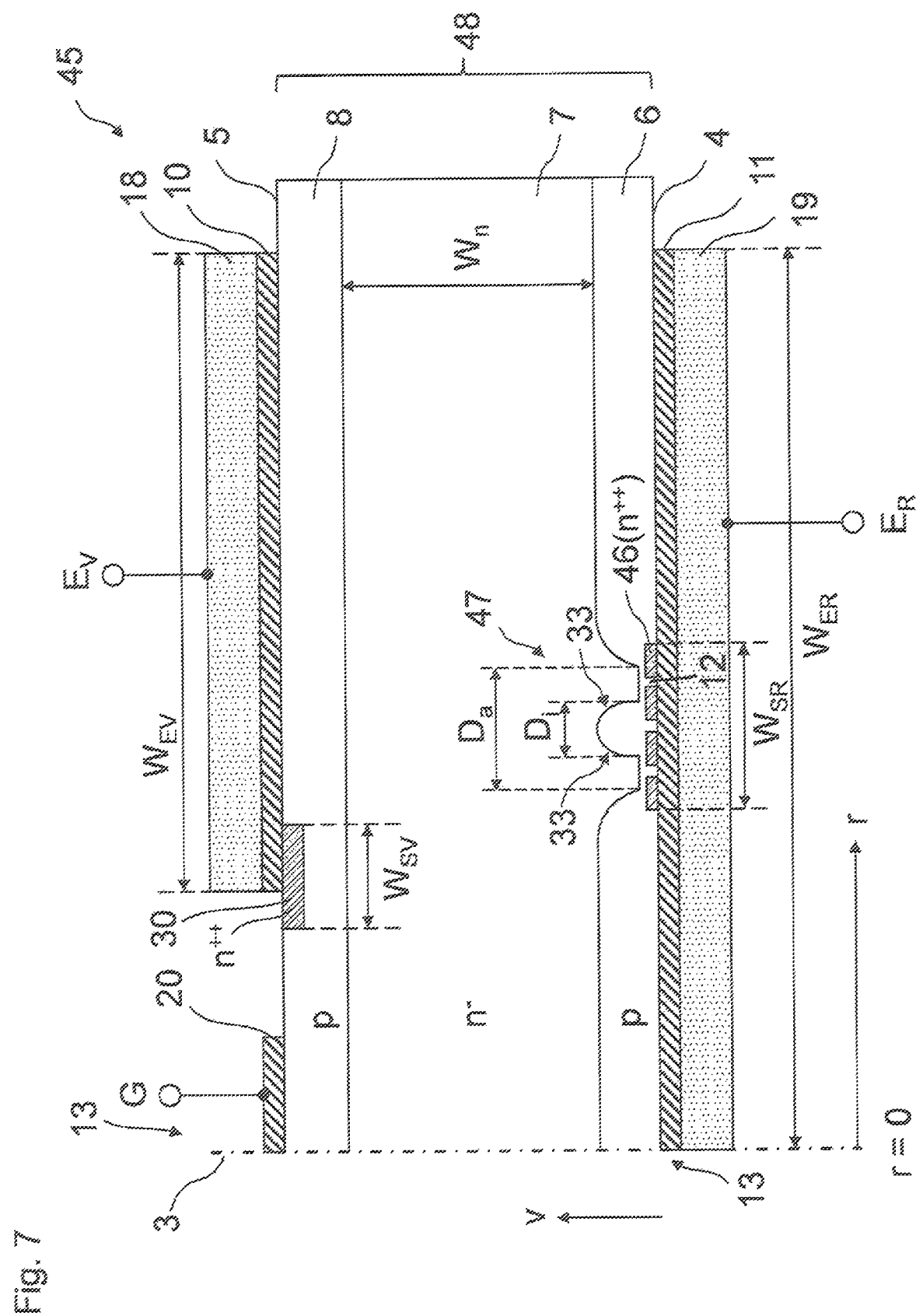
Figure 8:
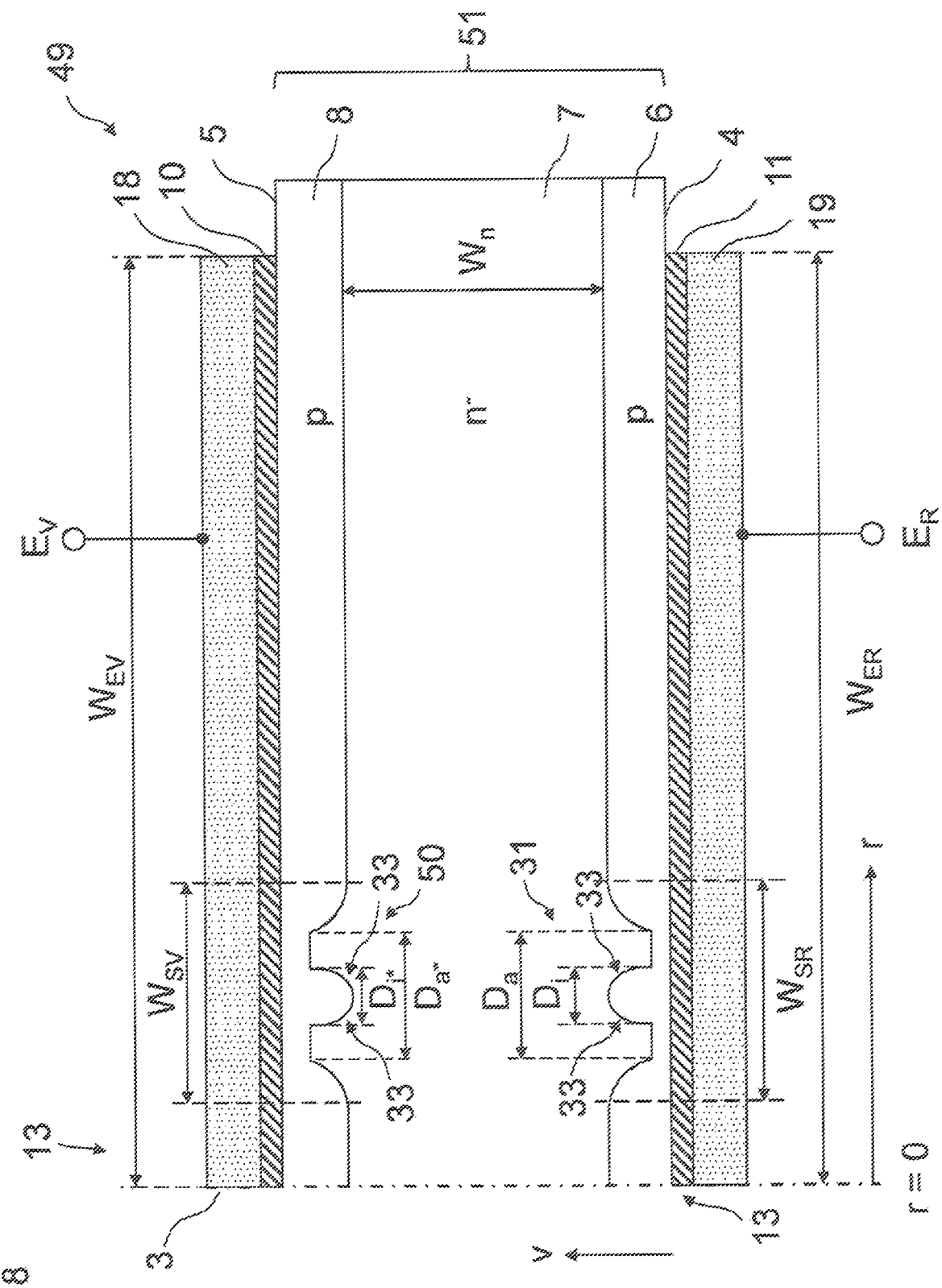
Figure 9:
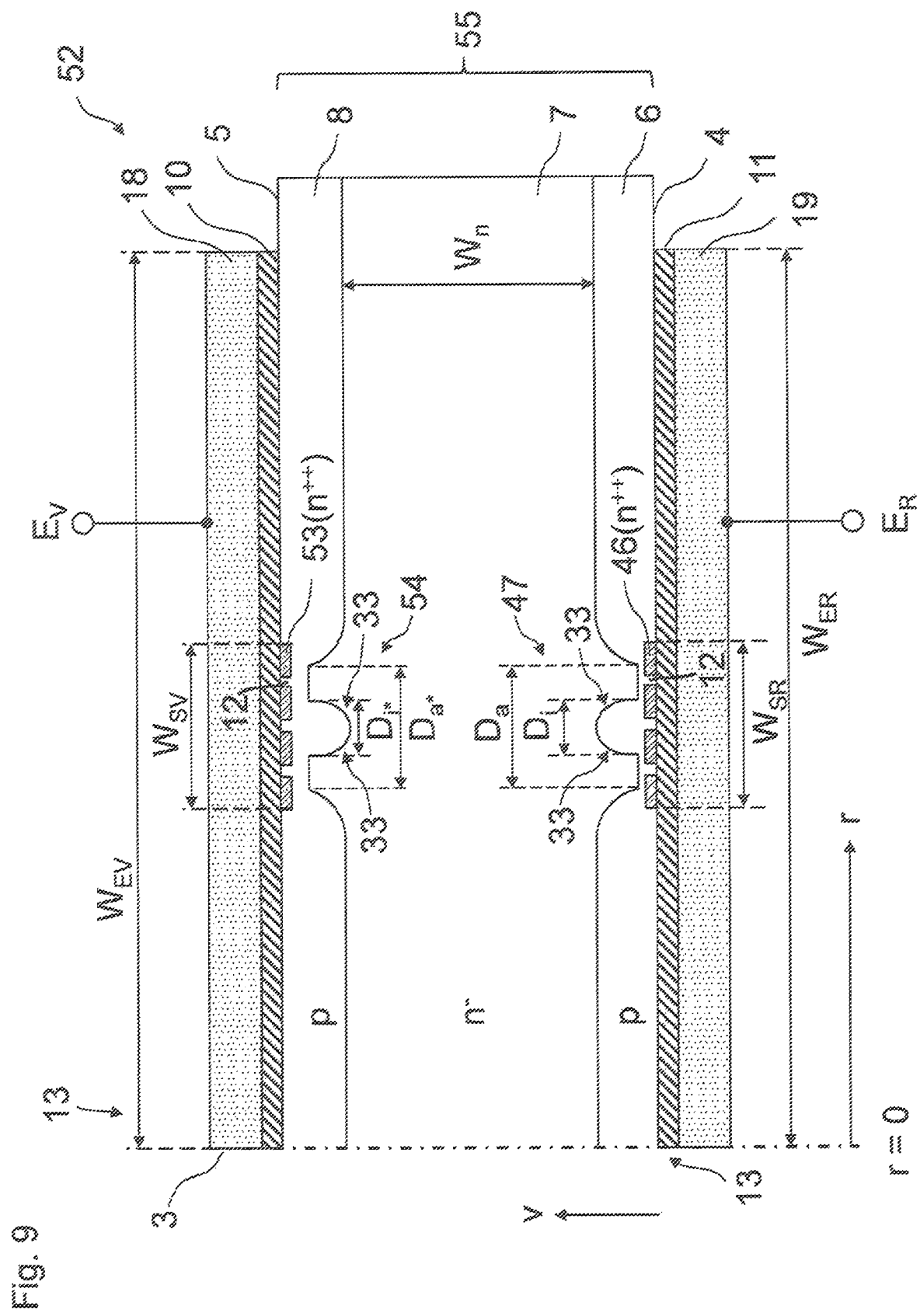
Figure 10:
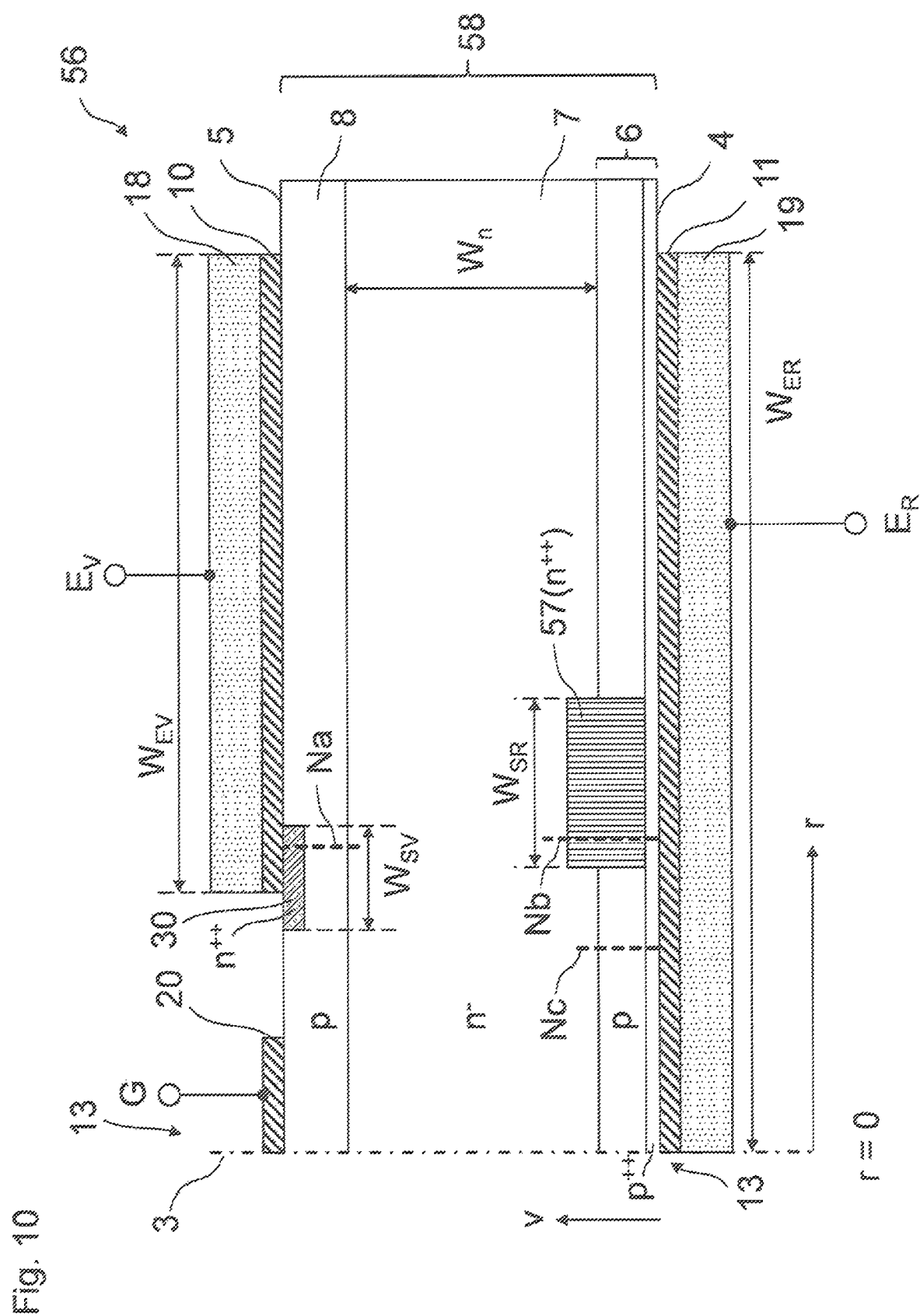
Figure 11:
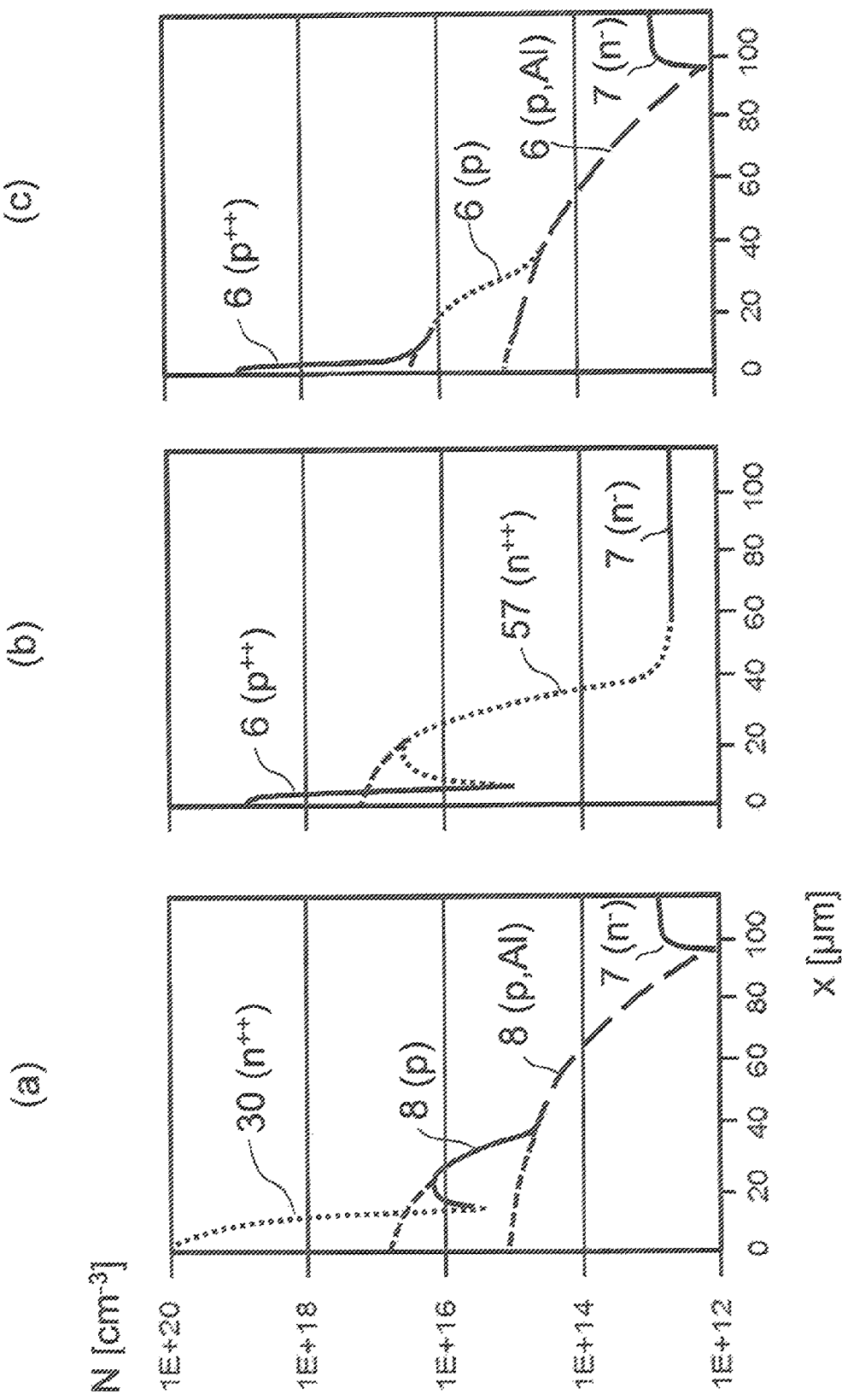
Figure 12:
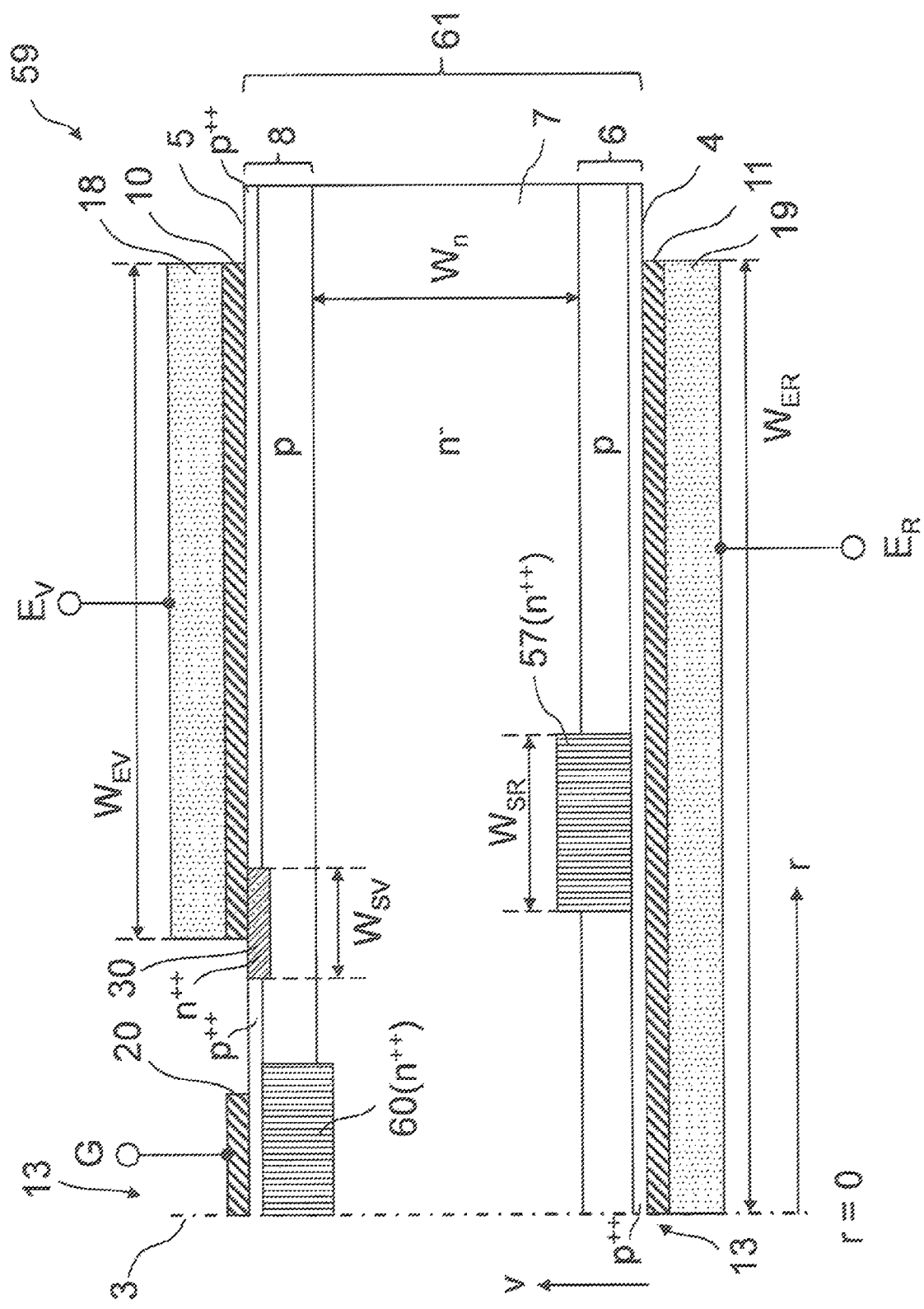
Figure 13:
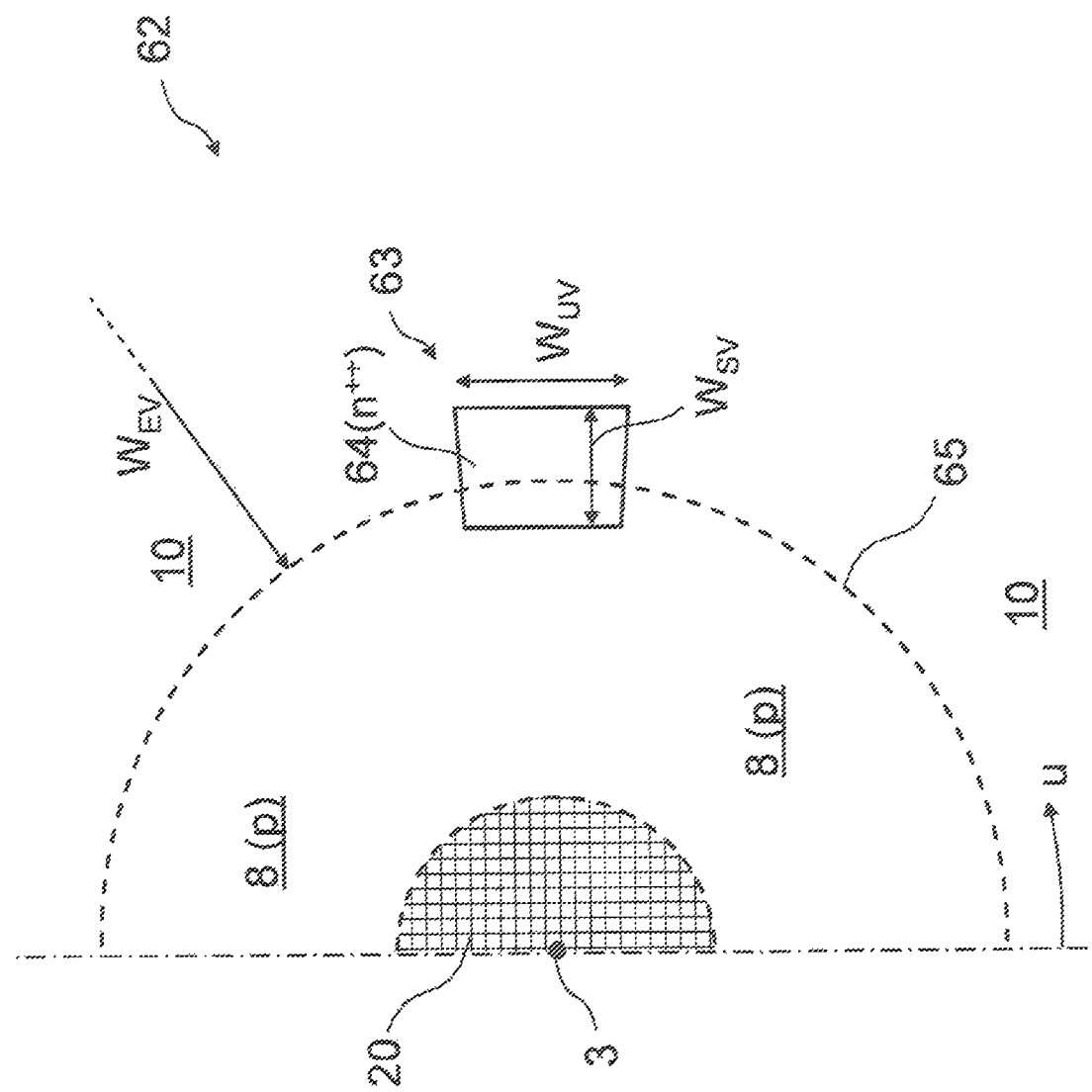
Figure 14:
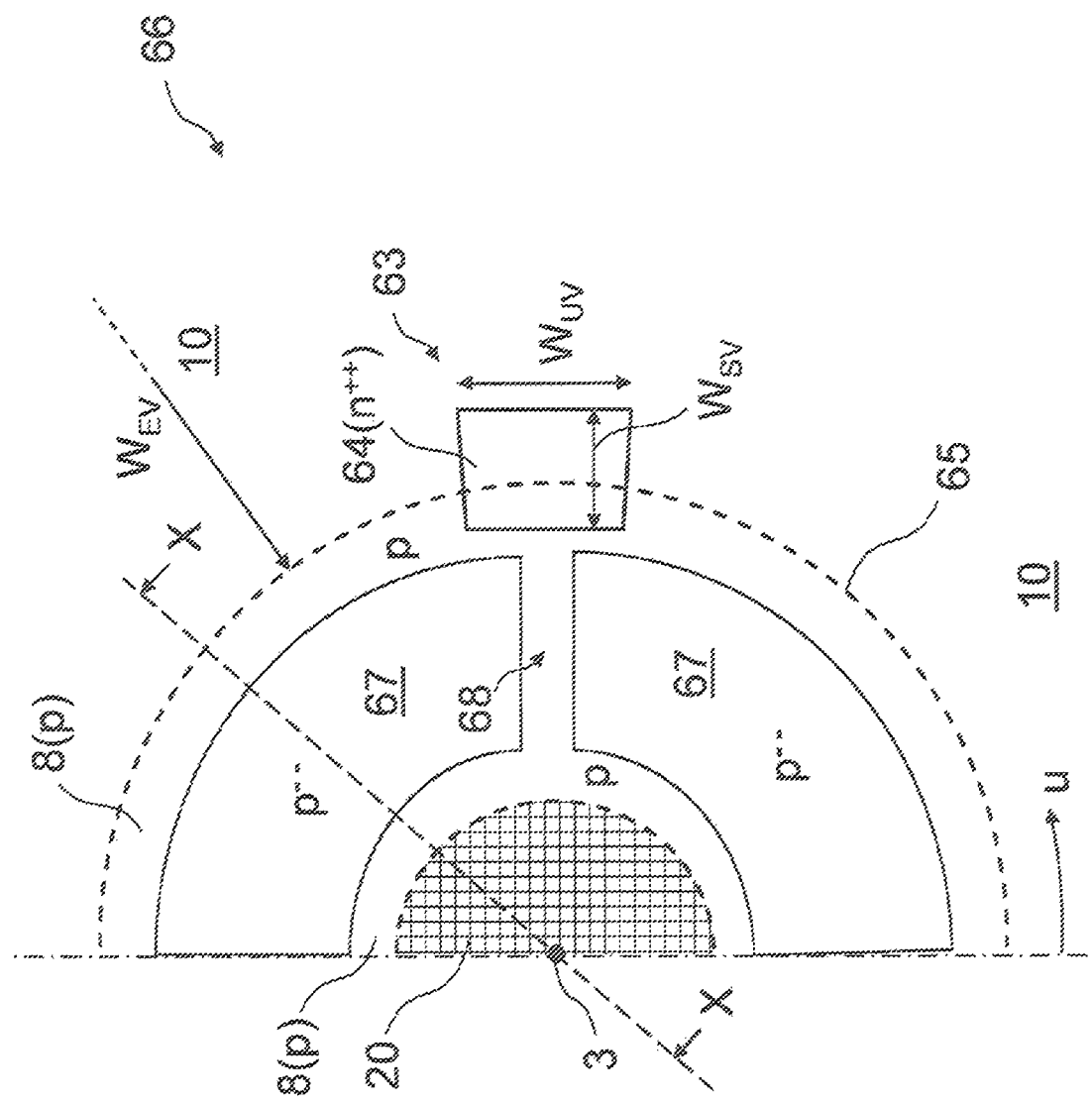
Figure 15:
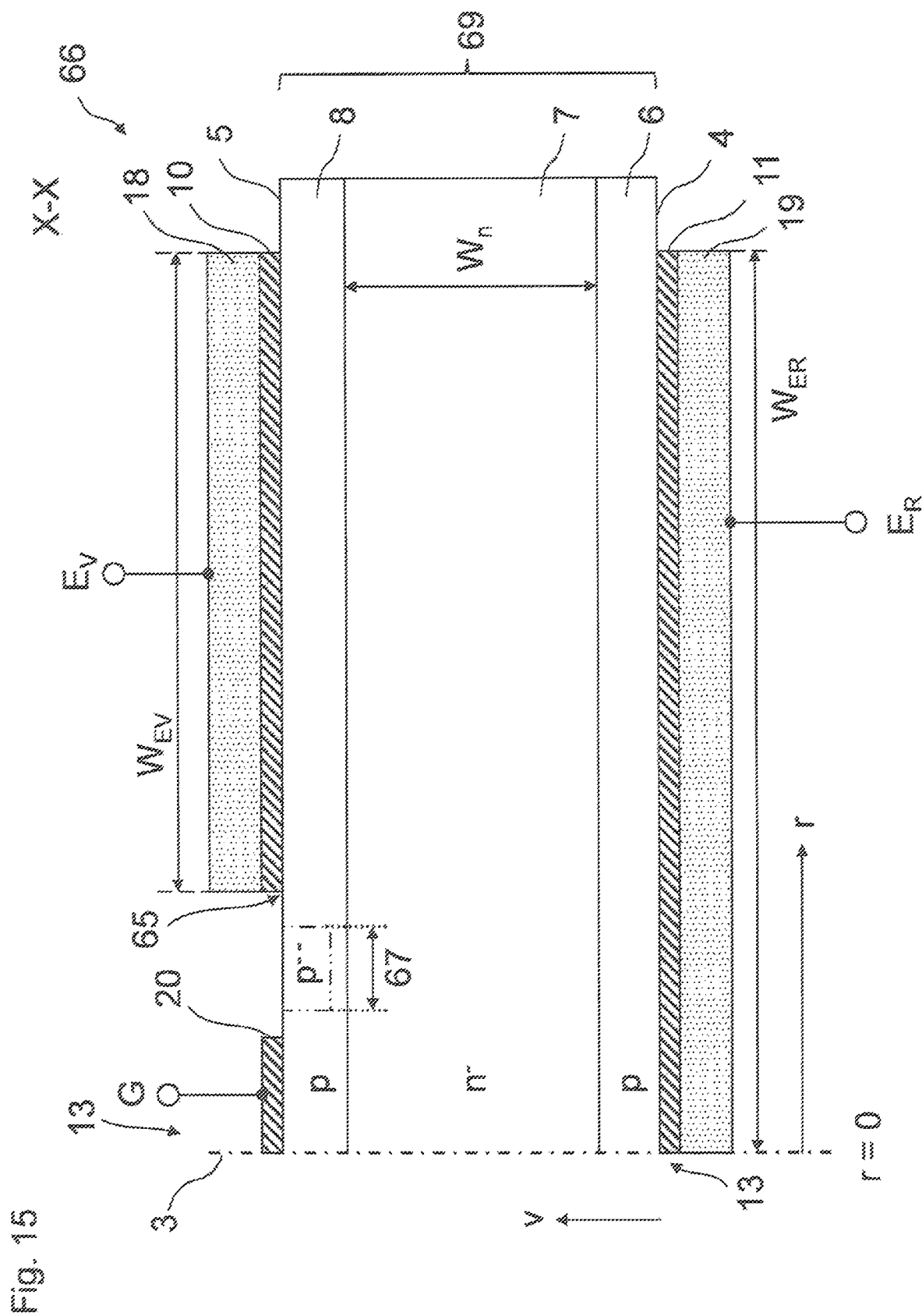
Figure 16:
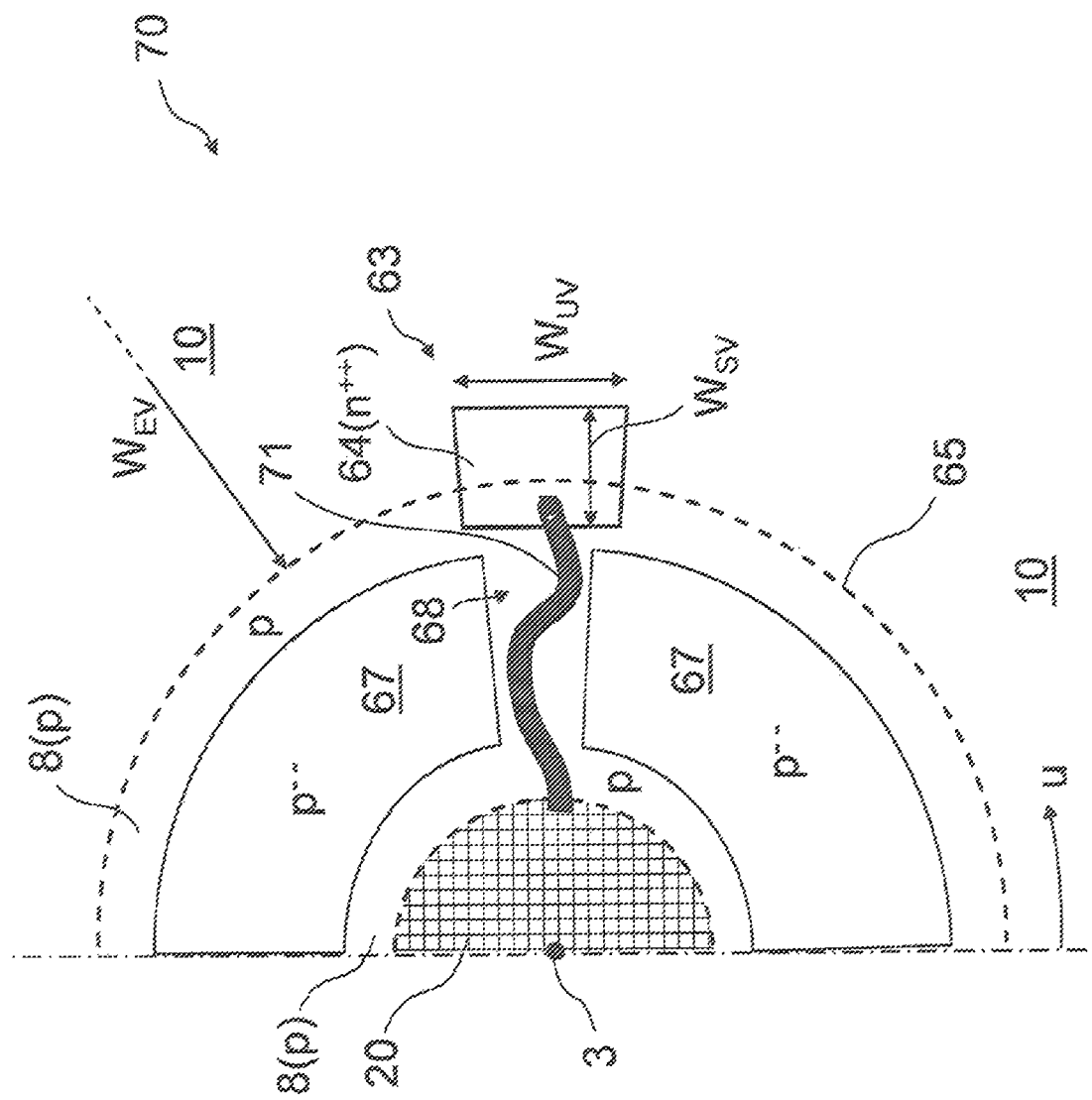
Figure 17:
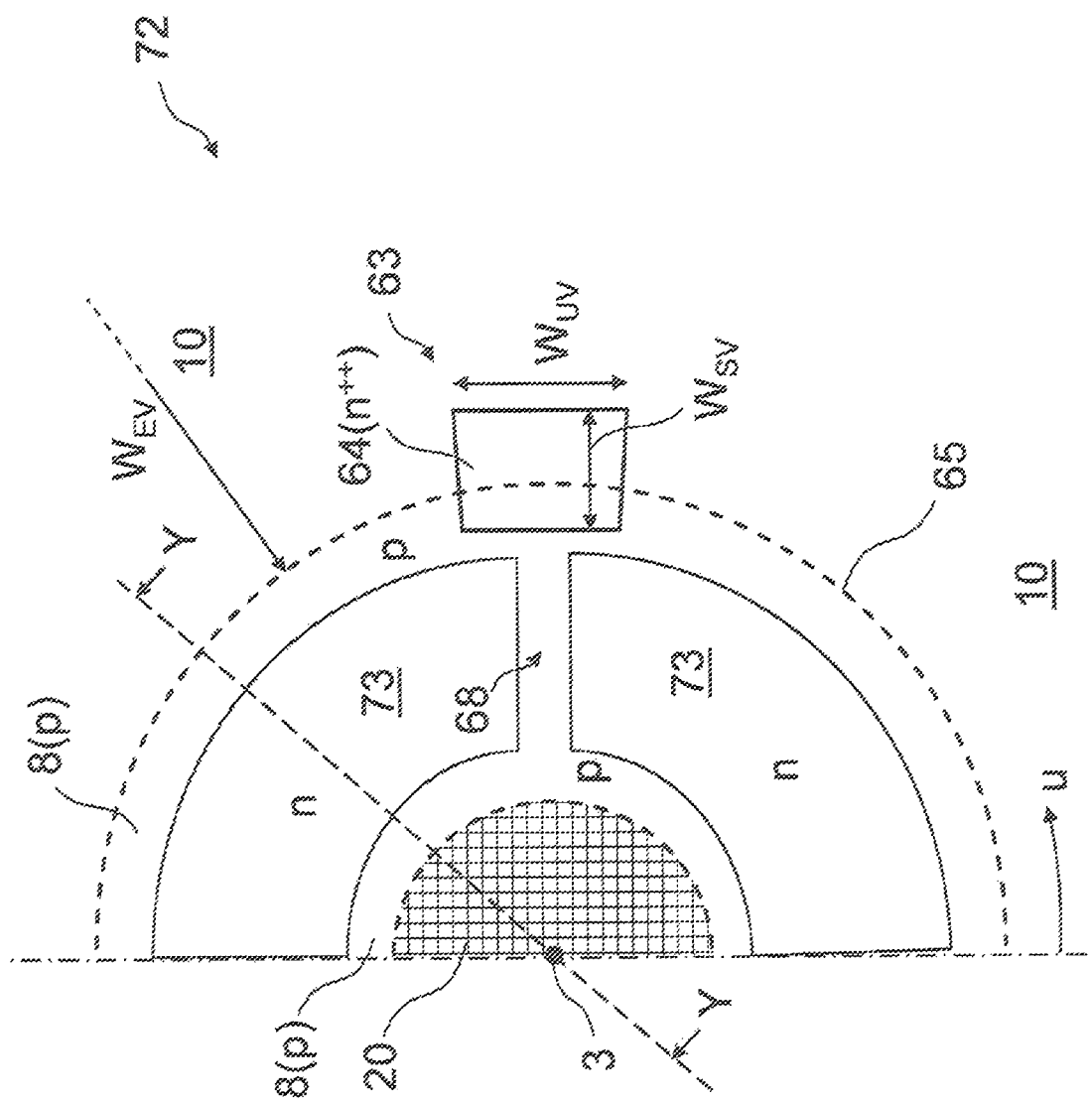

Other advantages and features of the invention become apparent from the following description as well of exemplary embodiments of the invention, which shall be understood not to be limiting and which will be explained below with reference to the drawing. In this drawing, the Figures schematically show:

FIG. 1 a vertical section through a prior art thyristor,

FIG. 2 a vertical section through an exemplary embodiment of a short-circuit semiconductor component according to the invention with a turn-on structure and a trigger structure, FIG. 3 a plan view of another exemplary embodiment of a short-circuit semiconductor component according to the invention with a fingered turn-on structure, FIG. 4 a vertical section through another exemplary embodiment of a short-circuit semiconductor component according to the invention with two turn-on structures and a trigger structure, FIG. 5 a vertical section through yet another exemplary embodiment of a short-circuit semiconductor component according to the invention with two turn-on structures and two trigger structures, FIG. 6 a vertical section through yet another exemplary embodiment of a short-circuit semiconductor component according to the invention with a turn-on structure and a trigger structure, FIG. 7 a vertical section through another exemplary embodiment of a short-circuit semiconductor component according to the invention with two turn-on structures and two trigger structures, FIG. 8 a vertical section through yet another exemplary embodiment of a short-circuit semiconductor component according to the invention with two turn-on structures, FIG. 9 a vertical section through yet another exemplary embodiment of a short-circuit semiconductor component according to the invention with two turn-on structures and two trigger structures, FIG. 10 a vertical section through another exemplary embodiment of a short-circuit semiconductor component according to the invention with two turn-on structures and a trigger structure, FIG. 11 in each of the views (a), (b) and (c), a concentration profile through the short-circuit semiconductor component of FIG. 10 along the concentration profile lines Na, Nb and Nc shown therein, FIG. 12 a vertical section through another exemplary embodiment of a short-circuit semiconductor component according to the invention with two turn-on structures and two trigger structures, FIG. 13 a partial plan view of yet another exemplary embodiment of a short-circuit semiconductor component according to the invention with a turn-on structure having a turn-on structure segment, which is open in a circumferential direction of the semiconductor body, and a trigger structure, FIG. 14 a partial plan view of yet another exemplary embodiment of a short-circuit semiconductor component according to the invention with a turn-on structure having a turn-on structure segment, which is open in a circumferential direction of the semiconductor body, and a trigger structure, FIG. 15 a vertical section through the short-circuit semiconductor component of FIG. 14 along the line of cut X-X, FIG. 16 a partial plan view of yet another exemplary embodiment of a short-circuit semiconductor component according to the invention with a turn-on structure having a turn-on structure segment, which is open in a circumferential direction of the semiconductor body, and a trigger structure, FIG. 17 a partial plan view of yet another exemplary embodiment of a short-circuit semiconductor component according to the invention with a turn-on structure having a turn-on structure segment, which is open in a circumferential direction of the semiconductor body, and a trigger structure, FIG. 18 a vertical section through the short-circuit semiconductor component of FIG. 17 along the line of cut Y-Y, In the different figures, parts that are equivalent with respect to their function are always provided with the same reference numerals, so that they are also only described once, as a rule.

FIG. 1 shows a vertical section through a prior art thyristor 1. The thyristor 1 has a semiconductor body 2 substantially having the shape of a very flat cylinder, whose base surfaces extend perpendicularly to a vertical direction v. Every direction perpendicular to the vertical direction v is herein referred to as a radial or lateral direction, wherein the lateral direction is denoted with the reference sign r in FIG. 1.

The semiconductor body 2 is formed from a semiconductor material, e.g. silicon, and has semiconductor regions doped in a p-conducting and n-conducting manner, which determine the electrical properties of the thyristor in a manner known per se. The thyristor 1 and/or the semiconductor body 2 are formed to be rotationally symmetric with respect to a center axis 3 extending in the vertical direction v.

In the semiconductor body 2 of the depicted prior-art thyristor 1, a p-doped rear-side base region 6, an n-doped inner region 7 and a p-doped front-side base region 8 are successively arranged in the vertical direction v starting from a rear side 4 towards a front side 5 located opposite the rear side 4.

An n-doped front-side emitter 9 is embedded into the p-doped front-side base region 8, adjacent to the front side 5 of the semiconductor body 2, wherein the front-side emitter 9 has a total lateral emitter width $W_{S1}$ determined by its lateral extent. Herein, the lateral overall structure width of the emitter 9 is understood to mean the distance of an inner side, which radially delimits the depicted emitter structure 9 the farthest towards the inside, from an outer side, which radially delimits the depicted emitter structure 9 the farthest towards the outside. The emitter 9 in the conventional thyristor 1 shown in FIG. 1 has a circumferentially closed ring structure which concentrically encloses the center axis 3, wherein the semiconductor body 2 or the thyristor 1 is formed substantially as a cylinder which is rotationally symmetric with respect to the center axis 3.

Furthermore, it is apparent from FIG. 1 that the n-doped front-side emitter 9 is electrically conductively connected to a metallization layer 10 (e.g. aluminum) which is applied to the front side 5, and which forms a front-side electrode 10 of the thyristor 1, wherein the front-side electrode 10 in the depicted example of the conventional thyristor 1 may also be referred to as a cathode electrode, which has a cathode connection K. The front-side electrode 10 has a total lateral front-side electrode width $W_{E1}$ determined by its lateral extent. The p-doped rear-side base region 6 is electrically conductively connected to a metallization layer 11 (e.g. aluminum) which is applied to the rear side 4, and which forms a rear-side electrode 11 of the thyristor 1, wherein the rear-side electrode 11 in the depicted example of the conventional thyristor 1 may also be referred to as an anode electrode, which has a anode connection A.

As is also apparent in FIG. 1, the n-doped front-side emitter 9 is interspersed, in a manner known per se, with short-circuits 12 (also referred to as cathode short-circuit), which are configured like columns and doped in a manner complementary to the front-side emitter 9, and which electrically connect the p-doped front-side base region 8 directly to the front-side electrode 10.

Moreover, it is apparent from FIG. 1 that the thyristor 1 has, in a center 13 (r=0) of the semiconductor body 2 defined by the geometrical center of gravity of the front side 5, a trigger structure in the form of a gate electrode 14, by means of which, depending on an electrical trigger or turn-on signal (gate current), an electrically conducting, low-resistance connection can be produced in a manner known per se between the front-side electrode 10 (here: cathode) and the rear-side electrode 11 (here: anode). Incidentally, a center 13, which corresponds to the lateral position of the front-side center 13 due to the symmetrical configuration of the semiconductor body 2, is also defined by the geometrical center of gravity of the rear side 4 of the semiconductor body 2, which is why the two centers are provided with the same reference numeral 13. The two centers 13 define the course of the center axis 3 (also referred to as axis of symmetry).

For example, if a positive potential is present between the rear-side electrode 11 and the front-side electrode 10, the n-p-n-p structure of the thyristor 1 blocking in the blocking direction ($U_D$) is triggered or turned on by the gate current (positive current direction from the gate 14 to the front-side electrode 10). During the turn-on process, the current plasma spreads, starting from the side of the highly n-doped front-side emitter 9 facing towards the center 13, radially or laterally outwards over the entire front-side electrode region $W_{E1}$ with a speed of about 0.1 mm/μs, until, depending on the diameter of the thyristor 1, the entire front-side electrode region $W_{E1}$ carries the current after about 1 to 4 ms, and a high load current flows between the front-side electrode (cathode) 10 and the rear-side electrode (anode) 11. Then, the forward voltage present in the conductive state of the thyristor 1 assumes its lowest value. Only when the current flowing through the thyristor 1 reaches the value zero again is it "extinguished" and changes into the blocking state ($U_R$ or negative potential between the rear-side electrode 11 and the front-side electrode 10). An intact, conventional thyristor structure as it is shown in FIG. 1 can be switched an arbitrary number of times between these two states.

The blocking voltage of the thyristor 1 is calculated from the minimum thickness $W_{n1}$ and the specific resistance p of the n-doped inner region 7, whereas its minimum surface of the n-doped front-side emitter 9 determines the strength of the admissible surge current and the forward losses (conduction losses). In this case, the thickness $W_{n1}$ cannot be chosen arbitrarily, for example in order to increase the blocking capacity, because this affects the surge current and the conduction losses negatively. Accordingly, the surface of the emitter 9 and the silicon thickness $W_{n1}$ are precisely tailored to the respective application of the conventional thyristor 1.

As is further apparent from FIG. 1, the lateral width $W_{S1}$ of the front-side emitter 9 is substantially equal to the lateral width $W_{E1}$ of the front-side electrode 10. As a result, the ratio of the lateral front-side emitter width $W_{S1}$ to the lateral front-side electrode width $W_{E1}$ substantially equals 1 or is even slightly greater than 1 in the conventional thyristor 1.

FIG. 2 shows a vertical section through an exemplary embodiment of a short-circuit semiconductor component 15 according to the invention. The short-circuit semiconductor component 15 has a semiconductor component 16 in which, similar to the conventional thyristor 1 shown in FIG. 1, a p-doped rear-side base region 6, an n-doped inner region 7 and a p-doped front-side base region 8 are successively arranged in the vertical direction v starting from the rear side 4 towards the front side 5 located opposite the rear side 4.

As is apparent from FIG. 2, the rear-side base region 6 is connected in an electrically conductive manner to the rear-side electrode 11 with a total lateral rear-side electrode width $W_{ER}$ determined by its lateral extent, which is applied to the rear side 4, and the front-side base region 8 is connected in an electrically conductive manner to the front-side electrode 10 with a lateral front-side electrode width $W_{EV}$ determined by its lateral extent, which is applied to the front side 5.

A front-side turn-on structure 17 with a lateral front-side turn-on structure width $W_{SV}$ determined by its lateral extent is embedded into the p-doped front-side base region 8, adjacent to the front side 5 of the semiconductor body 16. In the exemplary embodiment shown in FIG. 2, the front-side turn-on structure 17 is configured as an n-doped front-side emitter structure 17, which may be configured as a circumferentially closed ring and/or polygon structure, for example. As is apparent from FIG. 2, the emitter structure 17 is connected in an electrically conductive manner to the metallization layer 10 (e.g. aluminum) applied to the front side 5. As is also apparent, the front-side electrode 10 covers the front-side emitter structure 17 at least partially. In particular, FIG. 2 shows, at least in terms of orders of magnitude, that the coverage of the turn-on structure 17 by the front-side electrode 10 in the outer edge region, i.e. in the direction towards the radial outer edge of the short-circuit semiconductor component 15 (r>0) may be at least in the millimeter range, e.g. at least about 1 mm to 5 mm, or even greater. As is shown in FIG. 2, the emitter structure 17, at the radial inner side of the metallization layer 10 facing towards the center 13, protrudes slightly therefrom. In the exemplary embodiment shown in FIG. 2, the n-doped front-side emitter structure 17 is also interspersed with the short-circuits 12, which are configured like columns and doped in a manner complementary to the emitter structure 17 and which electrically connect the p-doped front-side base region 8 to the front-side electrode 10.

The form of the short circuits 12 may vary, depending on the strength of the desired short-circuit effect. Circular or polygonal, e.g. hexagonal, small point-shaped recesses within the contiguous emitter structure surface of the entire emitter structure 17 determined by the lateral front-side emitter structure width $W_{SV}$ are customary, wherein the short circuits 12 may have dimensions in the order of magnitude of about 100 μm. However, other forms of such short circuits 12 are possible, e.g. strip-like breaks or annular breaks that divide the emitter structure 17 into individual concentric rings. The width of such breaks is typically in the range of about 100 μm.

Compared to the conventional thyristor 1 shown in FIG. 1, the short-circuit effect of the short circuits 12 in the short-circuit semiconductor component 15 according to the invention can also be increased to a very large extent by means of a targeted design, e.g. by the short-circuit openings of the short circuits 12 being formed considerably larger than in the conventional thyristor 1 shown in FIG. 1, and/or by the density of the short circuits 12 relative to the emitter structure surface of the emitter structure 17 being selected so as to be considerably larger, i.e. the distance of adjacent short circuits 12 from one another being selected so as to be considerably smaller, than in the conventional thyristor 1. As a result, the surface area-specific surge current in kA/cm² in the short-circuit semiconductor component 15 according to the invention can be reduced even further (in contrast to the conventional thyristor 1, in which the surge current is known always to be maximized), in order to reliably ensure the shorting of the semiconductor body 16 in the case of a short circuit as described herein.

The two p-n or n-p junctions in the semiconductor body 16 arranged in the above-described manner produce a short-circuit semiconductor component 15 that blocks in both voltage polarities.

The fundamental difference between the short-circuit semiconductor component 15 shown in FIG. 2 and the conventional thyristor 1 shown in FIG. 1 is the ratio of the lateral turn-on or emitter structure width $W_{SV}$ to the lateral electrode width $W_{EV}$, which is significantly smaller than 1 in the short-circuit semiconductor component 15 and may preferably be selected so as to be less than ½ or even smaller.

Moreover, it is apparent from FIG. 2 that the front-side electrode 10 and the rear-side electrode 11 are each contacted, in particular press-contacted, in an electrically conductive manner by means of a metallic front-side and rear-side contact disk 18 and 19, respectively. The contact disks 18 and 19 may be configured as pure molybdenum disks or consist of a combination of a molybdenum and a copper disk, wherein molybdenum is preferably in direct contact with the respective electrode 10 or 11 of the semiconductor 16. The thickness of the contact disks 18 and 19 is preferably between 1 and 5 mm.

Furthermore, FIG. 2 shows a front-side trigger structure 20 of the short-circuit semiconductor component 15, which is configured as a gate electrode 20 and which contacts the front-side base region 8 in an electrically conductive manner, and which can be activated depending on an electrical turn-on signal supplied to the gate electrode 20 via its gate connection G and, as a consequence thereof, can turn on the front-side turn-on or emitter structure 17, which is electrically operatively connected to the gate electrode 20 via the front-side base region 8. After the turn-on or emitter structure 17 has been turned on, it produces, on a one-off basis, a permanent, irreversible, electrically conductive, low-resistance connection between the front-side electrode 10 and the rear-side electrode 11. In operation, the gate electrode 20 is contacted via an electrically conductive wire (not shown) pressed in place by spring action.

As was already mentioned above and is apparent from FIG. 2, the emitter structure 17, at the radial inner side of the metallization layer 10 facing towards the center 13, protrudes slightly therefrom. Here, this is necessary in order not to short-circuit the emitter structure 17. In the event of such a short circuit, the current of the turn-on signal supplied via the trigger structure or gate electrode 20 would be able to flow directly from it to the electrode 10, which, however, could at least partially affect the desired function of the turn-on or emitter structure 17 in a negative manner.

Furthermore, during operation, the short-circuit semiconductor component 15 is usually accommodated in a hermetically sealed ceramic capsule (not shown) configured as a housing. In order to supply the external electrical turn-on or gate signal, a metal tube is attached to the ceramic capsule, which is connected to the metallized gate region 20 via the wire for coupling in the external turn-on signal. Moreover, the ceramic capsule has two copper contact stamps, which rest directly on the contact disks 18 or 19 of the front-side electrode 10 or the rear side electrode 11 on both sides of the short-circuit semiconductor component 15. This short-circuit semiconductor component 15 located in the ceramic capsule is electrically connected to the outside via a corresponding mechanical pressure bond, which presses the two copper contact stamps together with a sufficiently high surface pressure, while, for control by means of the turn-on signal, the metal tube located in the ceramic capsule is connected, outside the capsule, to an electrical line via a suitable plug-in connection or firm solder joint.

Now, the main function of the short-circuit semiconductor component 15 according to the invention is that, given a single pulse of the turn-on or gate signal with a sufficient current level, the n-doped front-side emitter structure 17, which is close to the center and located in the vicinity of the gate electrode 20, is turned on and the semiconductor body 16 is destroyed by the fault current flowing through the electrode connections $E_V$ and $E_R$ in such a way that a fused portion or shorting 21 forms in the vicinity of the initially triggered region of the semiconductor body 16, whose size or radial/lateral extent depends, inter alia, also on the size of the short-circuit current flowing between the connections $E_V$ and $E_R$. After the fused material has cooled off, a metallic region forms, which is composed of the fused silicon of the semiconductor body 16 and the metal of the contact disks 18 or 19 and provides a permanently reliably conductive, low-resistance electrical connection (short circuit) between the two main connections $E_V$ and $E_R$. The strength of the fusing current is determined by a maximum surface, which is to be designed in accordance with the short circuit current to be permanently absorbed, for the n-doped front-side emitter structure 17, wherein the goal is as small a ratio $W_{SV}/W_{EV}$ as possible for small fusing currents, and the lateral width $W_{EV}$ of the metal contact disk 18 or of the front-side electrode 10 is set, in accordance with the strength of the short-circuit current, in such a way that the spatial extent of the shorted region 21 does not reach into an outer edge region of the short-circuit semiconductor component 15. In order to continue to prevent an edge failure caused by a possible overvoltage, the thickness $W_n$ of the n-doped inner region 7 determining the blocking capacity of the short-circuit semiconductor component 15 may be chosen so as to be of almost any size, wherein the specific resistance of the inner region 7 is also correspondingly adapted to the desired level of the blocking capacity.

Thus, in the short circuit component 15 shown in FIG. 2, an electrical turn-on signal is generated once in the case of an accident, which is applied to the gate electrode 20 in the center 13 of the semiconductor body 16 via the electrical supply line to the gate connection G. As a consequence, the n-p-n-p structure of the semiconductor body 16 is triggered or turned on, whereupon current flows between the front-side electrode 10 and the rear-side electrode 11, which leads to fusing 21 in the current-carrying region of the semiconductor body 16. Then, the short-circuit semiconductor component 15 is in a permanent, non-reversible, low-resistance current-carrying state.

The current-carrying capacity of the n-doped front-side emitter structure 17 is very much limited compared with the n-doped cathode-side emitter 9 of the conventional thyristor 1 shown in FIG. 1, because it is determined by the ratio of the lateral emitter structure width $W_{SV}$ of the n-doped front-side emitter structure 17 to the total width $W_{EV}$ of the surface contacted by the metallization or front-side electrode 10 and the contact disk 18.

The position of the n-doped front-side emitter structure 17 close to the center 13 of the semiconductor body 16 keeps the shorted region 21 in the vicinity of the initial triggering and prevents the plasma from escaping from the region of the semiconductor body 16 contacted by the front-side electrode 10 and the contact disk 18 and getting into the radially outer edge region. The structure of the exemplary embodiment of the short-circuit semiconductor component 15 shown in FIG. 2 thus ensures that the shorting 21 always remains within the region covered by the electrode 10 and the contact disk 18, i.e. within the electrode width $W_{EV}$.

FIG. 3 shows a plan view of another exemplary embodiment of a short-circuit semiconductor component 22 according to the invention with a fingered turn-on structure 23. In FIG. 3, a front-side electrode 24 can be seen which is applied to the front side of the semiconductor body 25 with a configuration according to the invention. A gate electrode 26 configured as a trigger structure which, as can be seen in FIG. 3, is radially spaced apart from the front-side electrode 24, is applied to the semiconductor body 25 in the center 13 of the short-circuit semiconductor component 22. As is also apparent from FIG. 3, the gate electrode 26 in the depicted short-circuit semiconductor component 22 has four trigger structure or gate fingers 27 that extend radially outward from the rest, i.e. the central region, of the gate electrode 26. The front-side electrode 24 has recesses corresponding to the gate fingers 27, so that the gate fingers 27 are able to extend radially outward, spaced apart from the electrode 24. In accordance with the recesses of the electrode 24, the turn-on structure 23, in this case an emitter structure, which is electrically contacted by the electrode 24, located underneath the electrode 24 and at least partially covered by the latter, and is embedded into the semiconductor body 25, has an extent following the contour of the electrode recesses.

The emitter structure 23 and its extent is indicated in FIG. 3 by a contour of the electrode recesses drawn with broad lines. Clearly, the lateral emitter structure width $W_{SV}$ thus corresponds substantially to the width of the contour drawn into FIG. 3. In cross section, the emitter structure 23 may, for example, by configured in a similar manner to the emitter structure 17 from FIG. 2 and also include the short circuits 12. However, this is not an absolute requirement.

In FIG. 3, it is apparent that the emitter structure 23 has, in the lateral direction r, four turn-on structure fingers 28 that extend radially outwards from the rest of the emitter structure 23 close to the center, i.e. from a region of the emitter structure 23 close to the center. In the exemplary embodiment of the short-circuit semiconductor component 22 shown in FIG. 3, the turn-on or emitter structure 23 is configured in a line-shape and so as to follow the contour of the electrode recesses. Such a line-shaped turn-on structure 23 may preferably have a lateral structure width $W_{SV}$ (see FIG. 2) of about 500 µm. As a result, the turn-on or emitter structure 23 shown in FIG. 3 is configured in part as a circumferentially closed ring structure and in part as a circumferentially polygon structure (emitter finger 28) extending radially outwards from the ring structure.

It is to be understood that the finger structure of the turn-on structure 23 and the corresponding finger structure of the trigger structure 26, in this case the gate electrode 26, may of course have many other conceivable designs. For example, the number of the turn-on structure fingers 28 or trigger structure fingers 27 is not limited to the number four shown in FIG. 3. More or fewer fingers may be provided. The extent of the fingers 28 or 27 is also not limited to the straight extent of the exemplary embodiment illustrated in FIG. 3. The extent may also be curved, for example. Furthermore, it is conceivable that from each finger 28 or 27, one or several branched-off finger sections may additionally extend from each finger 28 or 27 shown in FIG. 3, and that thus, fingers are formed that are branched off once or several times.

It is apparent from the illustration of FIG. 3 that the trigger structure 26 has trigger structure fingers 27 corresponding, i.e. following, the shape or contour of the turn-on structure fingers 28. Due to a uniform distance, in this case particularly in the lateral direction, between the trigger structure 26 and the turn-on structure 23, which is produced over the entire extent of the fingered turn-on structure 23, this embodiment ensures a uniform electrical effect of the trigger structure 26 on the turn-on structure 23.

The fingered turn-on structure 23 provides the fundamental advantage that the turned-on or triggered region of the short-circuit semiconductor component 22 may spread across a greater circumference. A lateral extent of the turn-on structure finger 28 from the rest of the turn-on structure 23 close to the center, i.e. a radial finger length $L_{SF}$ of the turn-on structure, is preferably selected to be less than $W_{EV}/2$. In the exemplary embodiment of the short-circuit semiconductor component 22 shown here, this also applies to the radial finger length of the trigger structure fingers 27. This measure helps to keep the fusing region 21 (see FIG. 2) away from, on the one hand, the center 13 of the semiconductor body 22 and thus from the gate electrode 26 and, on the other hand, also sufficiently far away from the radial outer edge of the short-circuit semiconductor component 22. Since the central region 13 in the exemplary embodiment of the short-circuit semiconductor component 22 shown in FIG. 3 is not covered by the electrode 24, and is therefore also not contacted or covered by the thick contact disk 18 (FIG. 2), plasma in the center 13 could be directed on to the electrical supply line to the gate connection G and on to the metal tube in the ceramic capsule (not shown), damaging the capsule. This is reliably prevented by the exemplary embodiment of the short-circuit semiconductor component 22 shown in FIG. 3 because the shorting 21 (FIG. 2) is always triggered within the region of the emitter structure 23 covered by the electrode 24 in the case of a short circuit.

FIG. 4 shows a vertical section through another exemplary embodiment of a short-circuit semiconductor component 29 according to the invention with two turn-on structures 30 and 31 and the trigger structure 20 (gate electrode). As is apparent from FIG. 4, the short-circuit semiconductor component 29 has in a semiconductor component 32 an n-doped front-side turn-on or emitter structure 30, whose lateral emitter structure width $W_{SV}$, compared to the lateral front-side electrode width $W_{EV}$, is selected to be considerably smaller still than in the short-circuit semiconductor component 15 from FIG. 2. It is also apparent from FIG. 4 that the emitter structure 30 in this exemplary embodiment does not have any short circuits 12, as shown in FIG. 2. The turn-on or emitter structure 30 can be configured as a circumferentially closed ring and/or polygon structure, which surrounds the trigger structure 20 at a certain radial distance. The emitter structure 30, at the radial inner side of the electrode 10 facing towards the center 13, also protrudes slightly therefrom, as was already described in connection with the emitter structure 17 in FIG. 2.

In addition to the trigger structure 20 formed by the gate electrode 20 and disposed in the center 13 of the semiconductor body 32, the semiconductor body 32 also has a second turn-on structure 31 in the form of a breakdown structure 31, which in this exemplary embodiment is configured as a circumferentially closed, annular BOD structure. Depending on the operating voltage present at the electrode connections $E_V$ and $E_R$, the short-circuit semiconductor component 29 can also be turned on by means of the breakdown structure 31; in the exemplary embodiment shown, at a negative polarity applied to the rear-side electrode 11 opposite the front-side electrode 10. In addition, it additionally serves for avoiding a blocking failure in the radially outer edge region of the short-circuit semiconductor component 29 in the case of an unpredictable overvoltage present at the electrode connections $E_V$ and $E_R$.

As is apparent from FIG. 4, the breakdown structure 31 is located on the side of the semiconductor body 32 opposite the front-side emitter structure 30 and thus constitutes a rear-side turn-on structure 31 of the short-circuit semiconductor component 29. In this case, the level of the breakdown voltage of this breakdown structure 31 is adjusted in such a way that it assumes its lowest value of the entire semiconductor body 32 precisely at the location where it is disposed and thus also reliably prevents a breakdown in the outer edge region of the semiconductor body 32. The radius of curvature of the p-n transition, i.e. its geometrical curvature, in a region marked with the reference numeral 33 in FIG. 4, together with the specific resistance and the ratio of the diameters $D_i$ (inner diameter) and $D_a$ (outer diameter) of the breakdown structure 31, determines the level of the breakdown voltage in a manner known per se, as it is described in DE 42 15 378 C1, for example. In the event an overvoltage occurs in the blocking direction $U_R$ (negative polarity at the rear-side electrode connection $E_R$), a steep increase of the blocking current flowing between the main connections $E_V$ and $E_R$ is produced in the region 33 above a certain voltage. In this case, the current density reaches values so high that, in the end, a local melt channel is produced between the two main connections $E_V$ and $E_R$. The blocking capacity of the n-p-n-p structure breaks down, and the short-circuit current results in shorting in the region of the BOD structure 31.

Because the breakdown structure 31 in the exemplary embodiment of the short-circuit semiconductor component 29 shown in FIG. 4 is a rear-side turn-on structure embedded into the rear-side base region 6, to which, in turn, the rear-side electrode 11 is applied, the ratio of the lateral rear-side turn-on structure width $W_{SR}$ of the breakdown structure 31 to the lateral rear-side electrode width $W_{ER}$ of the rear-side electrode 11 must also satisfy the condition according to the invention, $W_{SR}/W_{ER}<1$, which is obviously the case in the short-circuit semiconductor component 29 shown in FIG. 4.

As is apparent from FIG. 4, the lateral turn-on structure width $W_{SR}$ of the breakdown structure 31 is localized at the lateral region of the base region 6 in which the geometry of the p-n transition formed between this base region 6 and the inner region 7 is significantly changed compared to the geometry of the rest of the p-n transition, i.e. the p-n transition outside the region defined by the lateral rear-side turn-on structure width $W_{SR}$. In this case, it is to be understood, in particular, that a changed geometry of this p-n transition in the sense of the present invention is present only if, reliably, this change cannot be ascribed to the production-related tolerance deviations during the production of the base region 6 and the inner region 7 but is the result of targeted actions.

The breakdown structure 31 of the short-circuit semiconductor component 29 shown in FIG. 4 has a ring shape surrounding the center 13 of the semiconductor body 32 and, accordingly, is radially spaced from the center 13. In particular, the breakdown structure or rear-side turn-on structure 31 in the exemplary embodiment of the short-circuit semiconductor component 29 shown in FIG. 4 is completely covered by the front-side electrode 10 and the rear-side electrode 11. The complete front and rear-side coverage of the breakdown structure 31 is advantageous in that an escape of plasma from the semiconductor body 29 is reliably prevented by the local delimitation of the shorting in the region around the breakdown structure 31 covered on both sides by the electrodes 10 and 11.

In principle, however, the breakdown structure 31 functioning as a turn-on structure may also be disposed in the center 13 of the semiconductor body 32, as is also described, for example, in DE 42 15 378 C1. In such a case, which is not shown in FIG. 4, the breakdown structure 31 would preferably be covered, both on the front side 5 of the semiconductor body 32 and on its rear side 4, by the respective electrodes 10 and 11, in order to obtain the same effect with regard to the escape of plasma as described above. In other words, a short-circuit semiconductor component with at least one turn-on structure disposed in the center, particularly a breakdown structure configured as a turn-on structure, would not require any trigger structure disposed there, such as the gate electrode 20 with a gate connection G shown in FIG. 4. Since the breakdown structure 31 draws the turn-on signal from the voltage present at the electrode connections $E_V$ and $E_R$, an additionally supplied external turn-on signal can be omitted.

Here, it may be noted that the breakdown structure 31 shown in FIG. 4 as a BOD structure may also be replaced with any other breakdown structure with a similar effect known per se, provided that, as a turn-on structure, it is configured to initiate the shorting of the corresponding short-circuit semiconductor component in accordance with a turn-on signal which, in the case of a breakdown structure integrated into the semiconductor body, implicitly always results from the electrical voltage present at the outer electrodes 10 and 11. Similar other breakdown structures are, for example, a breakdown structure having a du/dt protection known per se, or breakdown structure including a circuit-commutated turn-off time protection with a local increase of carrier lifetime known per se. Yet another breakdown structure, which is an alternative for the breakdown structure 31, will be described below in conjunction with the explanation of FIGS. 10 and 11.

FIG. 5 shows a vertical section through yet another exemplary embodiment of a short-circuit semiconductor component 34 according to the invention with two turn-on structures 35, 36 and two trigger structures 37, 38. The two turn-on structures 35 and 36 are each configured as n-doped emitter structures that are respectively embedded in the front-side or rear-side base region 8 or 6 of a semiconductor body 39. The turn-on or emitter structures 35, 36 can be configured as circumferentially closed ring and/or polygon structures. As is clearly apparent from FIG. 5, the two emitter structures 35 and 36 each protrude slightly over the radial inner edge, which faces towards the respective center 13, of the respective electrode 10 or 10. The two trigger structures 37 and 38 are each configured as gate electrodes 37, 38 with one front or rear-side gate connection $G_V$ or $G_R$ each, wherein the front-side gate electrode 37 is disposed in the center 13 of the front-side base region 8 so as to electrically contact the latter, and the gate electrode 38 is disposed in the center 13 of the rear-side base region 6. In the exemplary embodiment of the short-circuit semiconductor component 34 shown in FIG. 5, both turn-on structures 35, 36 have the same lateral turn-on structure width $W_{SV}$ or $W_{SR}$, which, however, is not an absolute requirement. In the short-circuit semiconductor component 34, the lateral electrode widths $W_{EV}$ and $W_{ER}$ of the front or rear-side electrodes 10 and 11 also have the same size, which is also not an absolute requirement. Consequently, the short-circuit semiconductor component 34 has a completely symmetrical structure with respect to the vertical direction. The lateral electrode widths $W_{EV}$ and $W_{ER}$ are considerably larger than the corresponding lateral turn-on structure widths $W_{SV}$ or $W_{SR}$ so that the conditions $W_{SV}/W_{EV}<1$ and $W_{SR}/W_{ER}<1$ also apply with regard to this short-circuit semiconductor component 34. Accordingly, the short-circuit semiconductor component 34 can be turned on both via an electrical turn-on signal supplied to the front-side gate connection $G_V$ as well as via an electrical turn-on signal supplied to the rear-side gate connection $G_R$.

FIG. 6 depicts a vertical section through yet another exemplary embodiment of a short-circuit semiconductor component 40 according to the invention with a turn-on structure 41 and a trigger structure 42. In a semiconductor body 43, the turn-on structure 41 is embedded into the front-side base region 8 as an n-doped front-side emitter structure 41 with short circuits 12. In this exemplary embodiment, the trigger structure 42 is configured as a photosensitive portion 42 in the center 13 of the front-side base region 8. In this case, the turn-on signal externally supplied to the trigger structure or the photosensitive portion 42 is an optical turn-on signal 44. The turn-on or emitter structure 41 may be configured as a circumferentially closed ring and/or polygon structure and, as is apparent from FIG. 6, protrudes slightly over the radial inner edge, which faces towards the center 13, of the electrode 10. Lasers or, particularly preferably, less expensive LEDs are suitable light sources for generating the optical signal 44.

As is apparent from FIG. 6, an amplifying gate structure AG, which in this case is functionally coupled to the photosensitive portion 42 and consists of multiple stages, is adjacent to the photosensitive portion 42 disposed in the center 13 and extends radially outwards. The photosensitive portion 42, which is disposed in the center 13 and is associated with the 1st AG stage (radially innermost AG stage) and is arranged within the latter, has no metallization so that the optical signal 44 can penetrate the silicon of the semiconductor body 43. The diameter of the 1st AG stage, which is also referred to as an optical gate 42 because the optical signal 44 is coupled in here, has a value in the range of about 1-2 mm. Because of its dimensions being very small compared with gate electrodes, the optical gate 42 is protected, by a limiting resistor R integrated into the p-doped front-side base region 8 as it is also realized in a conventional light-triggered thyristor (LTT), against destruction when the short-circuit semiconductor component 40 is turned on. Without this resistor R, there would be a danger of the short-circuit semiconductor component 40 being destroyed, not in the region of the n-doped front-side emitter structure 41 covered by the front-side electrode 10 and the contact disk 18 contacting the latter, but rather in the non-contacted region in the optical gate 42, which could result in plasma escaping at that location in the event of a short circuit of the short-circuit semiconductor component 40. Thus, the current limiting resistor R ensures that in the event of a turn-on process (short-circuit event of the semiconductor component 40) triggered by the optical signal 44, the turn-on structure 41, in this case the emitter structure 41, is always turned on before a failure or a destruction of the region between the trigger structure 42 and the turn-on structure 41 not contacted by the contact disk 18 can occur.

A short-circuit semiconductor component (not shown) which can be controlled, i.e. turned on, electrically as well as optically, is also conceivable. Accordingly, this short-circuit semiconductor component would have two trigger structures connected in parallel, i.e. both a gate electrode and a photosensitive portion. Such a structure is described in more detail in DE 10 2004 025 082 B4, for instance. Like the optical gate 42 of the short-circuit semiconductor component 40, the optical gate is in this case located in the center 13 of the respective semiconductor component and is also protected against an excessive turn-on current by an upstream limiting resistor R, as shown in FIG. 6. In this case, the gate connection for the electrical connection of the turn-on signal contacts a metallized ring, which is located radially outside the resistor R and surrounds the optical gate.

With respect to the illustration of the short-circuit semiconductor component 40 in FIG. 6, it may also be remarked that, instead of an externally supplied turn-on signal, e.g. instead of the optical turn-on signal 44 shown in FIG. 6, a breakdown structure (not shown) as it has already been described herein can also be disposed as a trigger structure in the region of the 1st AG stage close to the center, wherein the breakdown structure, as was already explained in various places herein, may be configured as a BOD structure and/or as a breakdown structure having a common du/dt protection and/or a breakdown structure including a common circuit-commutated turn-off time protection with a local increase of carrier lifetime. In this case, the shorting of such a short-circuit semiconductor component would be triggered by reaching or exceeding the breakdown voltage determined for the provided breakdown structure, which is directly dependent on the electrical voltage present on the outer electrodes 10 and 11, wherein the avalanche current of the breakdown structure in this case controls, i.e. turns on, one or several of the amplifying gates AG forming the AG structure, which in turn turns on the turn-on structure, e.g. an emitter structure, in order to finally initiate the shorting of the short-circuit semiconductor component which, in the short-circuit semiconductor component according to the invention, always occurs in the region of the turn-on structure covered by the respective electrode 10 or 11. It must be noted that in this case, the breakdown structure disposed close to the center and located radially within the 1st AG stage is not covered by the corresponding main electrode, i.e. the electrode 10 or 11 applied to the base region containing the breakdown structure, and the contact disk 18 or 19 contacting this electrode, because the AG structure is disposed, in the radial direction r, between the breakdown structure and the main electrode 10 or 11.

Here, it may be remarked that the amplifying gate structure AG shown in FIG. 6 may be combined with all trigger structures described herein alone, or also with two or more trigger structures of different types. The AG structure may have only one or also several AG stages, as shown in FIG. 6. However, providing the AG stages is not an absolute requirement. If, for example, a sufficiently powerful turn-on signal is ensured, an AG structure amplifying the turn-on signal could be dispensed with, such as in the case of an optical turn-on signal with a light output equal to or greater than about 1000 mW supplied to a photosensitive portion configured as a trigger structure.

FIG. 7 shows a vertical section through another exemplary embodiment of a short-circuit semiconductor component 45 according to the invention with two turn-on structures 30 and 46 and two trigger structures 20 and 47. In a semiconductor body 48, the rear-side turn-on structure 46 is embedded, as an n-doped emitter structure 46 with short circuits 12 and a lateral rear-side turn-on structure width $W_{SR}$, into the rear-side base region 6, adjacent to the rear side 4, and contacted in an electrically conductive manner and completely covered by the rear-side electrode 11. The turn-on or emitter structure 46 can be configured as a circumferentially closed ring and/or polygon structure. The rear-side trigger structure 47, which is configured as a breakdown structure, e.g. as a BOD structure, is disposed in the same lateral region of the turn-on structure 46, but offset therefrom in the vertical direction v. As was already explained in connection with FIG. 4, when the breakdown voltage set for the breakdown structure 47, which is directly dependent on the electrical voltage that is present at the outer electrodes 10 and 11 and serves as a turn-on signal, is reached or exceeded, a steep, locally limited current increase sets in in the region 33 used in the example of the short-circuit semiconductor component 45 shown in FIG. 7 for turning on the rear-side emitter structure 46, whereby the shorting of the short-circuit semiconductor component 45 is ultimately initiated. Providing the emitter structure 46 as a turn-on structure which is turned on by the breakdown structure 47 offers the advantage of a lateral expansion of the shorted region compared with the turn-on structure 31 shown in FIG. 4, which is configured as a breakdown structure, in which the melt channel emanating from the breakdown structure 31 towards the shorting is locally narrowly limited. Because of the lateral expansion of the melt channel, the emitter structure 46 helps having the shorting process progress more "softly". Due to the reduced conduction resistance, a cross-sectionally larger shorting region in the semiconductor body 48 also permits a permanent conduction of greater short-circuit currents with lower conduction losses.

FIG. 8 shows a vertical section through yet another exemplary embodiment of a short-circuit semiconductor component 49 according to the invention with two turn-on structures 31 and 50. In a semiconductor body 51, the breakdown structure 31 already shown in FIG. 4 is arranged between the rear-side base region 6 and the inner region 7 as a rear-side turn-on structure, and the front-side turn-on structure 50, which is also configured as a breakdown structure, is arranged between the front-side base region 8 and the inner region 7. The two breakdown structures 31 and 50 are, in each case by way of example, configured as circumferentially closed annular BOD structures. The inner diameter $D_{i*}$ and the outer diameter $D_{a*}$ of the breakdown structure 50 may be respectively different from the inner diameter $D_i$ and the outer diameter $D_a$ of the breakdown structure 31. In this case, the breakdown structures 31 and 50 could be designed for different breakdown voltages. However, this is not an absolute requirement, so that the two breakdown structures 31 and 50 may also be identically configured, so that the same breakdown voltages may be set for both.

Since a breakdown occurs in a breakdown structure only from a breakdown voltage of a certain polarity set in accordance with the particular configuration of the breakdown structure, the configuration of the short-circuit semiconductor component 49 shown in FIG. 8 offers the advantage, inter alia, that, with the two breakdown structures 31 and 50 provided in the semiconductor body 51, which are associated in one case with the front-side base region 8 and in the other case with the rear-side base region 6, the short-circuit semiconductor component 49 can be shorted both for an electrical voltage of a first polarity present at the main electrode 10 and 11 and for an electrical voltage of a second polarity, which is inverse to the first polarity and present at the main electrode 10 and 11, as soon as the respective breakdown structure 31 or 50 is turned on when its respective breakdown voltage is exceeded.

Further, it is apparent from FIG. 8 that both the front-side electrode 10 and the rear-side electrode 11 cover the respective center 13 completely, because no additional external turn-on signal has to be supplied to the short-circuit semiconductor component 49. Though the two breakdown structures 31 and 50 are shown in FIG. 8 to be spaced apart from the center 13, it is clear, however, that one or both breakdown structures 31 and 50 may in this case also be disposed directly in the respective center 13, with the advantages already described herein.

FIG. 9 shows a vertical section through yet another exemplary embodiment of a short-circuit semiconductor component 52 according to the invention with two turn-on structures 46 and 53 and two trigger structures 47 and 54. The turn-on structure 46, which was already shown in FIG. 7 and is configured as an emitter structure, and the rear-side trigger structure 47, which is electrically operatively connected therewith and configured as a breakdown structure, are embedded into the rear side of a semiconductor body 55. On the front side, the front-side turn-on structure 53 configured as an n-doped emitter structure is similarly embedded into the front-side base region 8, adjacent to the front side 5, and electrically contacted by the front-side electrode 10. The front-side emitter structure 53 is associated with the front-side trigger structure 54, which is also configured as a breakdown structure and which turns on the emitter structure 53 in the event of a breakdown. The mode of action of the combination of the front-side emitter structure 53 with the front-side breakdown structure 54 corresponds to the combination of the rear-side emitter structure 46 with the rear-side breakdown structure 47, and was already explained in connection with the description of FIG. 7. Both turn-on or emitter structures 46, 53 and both trigger structures 47, 54 can be configured, respectively, as circumferentially closed ring and/or polygon structures.

As was already mentioned for the configuration of the short-circuit semiconductor component 49 according to FIG. 8, the turn-on or trigger structures 46, 53, 46, 54 of the short-circuit semiconductor component 52 may be arranged exactly centrally, i.e. in the respective center 13.

FIG. 10 shows a vertical section through another exemplary embodiment of a short-circuit semiconductor component 56 according to the invention with two turn-on structures 30 and 57 and a trigger structure 20. In addition to the front-side turn-on structure 30 known from FIG. 4, the rear-side turn-on structure 57 is embedded in the form of yet another configuration of a breakdown structure into a semiconductor body 58. It is clearly apparent in FIG. 10, in particular, that the rear-side turn-on structure 57 is locally limited, in particular locally limited in the radial direction r, and thus has a lateral structure width $W_{SR}$ that is significantly smaller than the lateral electrode width $W_{ER}$ of the associated rear-side electrode 11, as is the case in all lateral turn-on structure widths disclosed herein, relative to the corresponding lateral electrode widths of the respective electrodes of the short-circuit semiconductor component according to the invention.

It is further apparent from FIG. 10 that the rear-side base region 6 has a flat $p^{++}$-region, which faces towards the rear side 4 and is highly p-doped compared with the region facing towards the inner region 7. In a lateral portion corresponding to the lateral turn-on structure width $W_{SR}$, an $n^{++}$-region, which is much more highly n-doped compared with the n-doped inner region 7 and which reaches into the inner region 7 in the vertical direction v, is embedded into the usually p-doped region of the rear-side base region 6. The $n^{++}$-region does not reach the rear side 4 of the semiconductor body 58 to which the rear-side electrode 11 is applied, because the highly doped $p^{++}$-region of the base region 6 spaces the inserted $n^{++}$-region from the rear side 4 contacted by the electrode 11. The concentration of the $p^{++}$-region of the rear-side base region 6 is selected so as to be higher than the concentration of the $n^{++}$-region interrupting the p-region of the base region 6 in order to prevent a short circuit between the inner region 7 and the rear-side electrode 11.

A breakdown voltage can also be set in a targeted manner for the breakdown structure 57 shown in FIG. 10, e.g. by the selection of the doping concentration of the weakly n-doped inner region 7 and/or the highly doped $n^{++}$-region and/or the p-doped base region 6, particularly of its highly doped $p^{++}$-region, which spaces the breakdown structure 57 from the rear side 4 of the semiconductor body 58, wherein the breakdown voltage of the breakdown structure 57 decreases the higher the concentration of its $n^{++}$-region and/or the $p^{++}$-region of the base region 6 is selected to be. In this way, breakdown voltages in the range far below 10 V up to the maximum possible blocking capacity of the semiconductor body 58 can be set.

FIG. 11, in each of the views (a), (b) and (c), shows a concentration profile through the short-circuit semiconductor component 56 of FIG. 10 along the concentration profile lines Na, Nb and Nc shown therein. Accordingly, FIG. 11a shows the concentration profile along the profile line Na shown in FIG. 10, FIG. 11b shows the concentration profile along the profile line Nb, and FIG. 11c shows the concentration profile along the profile line Nc. In the respective concentration profiles of FIGS. 11a, 11b and 11c, the penetration depth x in μm of the respective dopant is plotted along the respective abscissa. The ordinates each represent the concentration N per $cm^{-3}$ of the respective dopant.

FIG. 11a shows the concentration profile along the profile line Na shown in FIG. 10, which extends from the front side 5 of the semiconductor body 58 through the front-side turn-on or emitter structure 30 and the front-side base region 8 into the inner region 7. Starting from x=0, the flat profile, i.e. a profile with a low penetration depth (in this case less than about 20 μm) of the, for example phosphorus-doped, $n^{++}$-emitter structure 30 with a high concentration (up to about 1E20 $cm^{-3}$) can be seen in FIG. 11a in the form of a dotted curve. This is followed, with an increasing penetration depth x (from about 20 μm to about 40 μm), by the concentration profile of the p-base region 8, which is doped with boron, for example, in the shape of a continuous curve. In the short-circuit semiconductor component 56 shown in FIG. 10, the first boron-doped p-region of the base region 8 is preceded by an aluminum-doped (Al) second p-region of the base region 8 with a significantly lower concentration (e.g. between about 1E13 to about 1E15 $cm^{-3}$), as is apparent from the concentration profile of FIG. 11a with reference to the dashed curve. However, this Al-profile in the base region 8 is not an absolute requirement. As the penetration depth x increases further (in this case starting at about 100 μm) over the course of the concentration profile of FIG. 11a, the base region 8 is followed by the profile of the weakly n-doped inner region 7 with a substantially constant concentration (in this case about 1E13 $cm^{-3}$).

FIG. 11b shows the concentration profile along the profile line Nb shown in FIG. 10, which extends from the rear side 4 of the semiconductor body 58 through the rear-side base region 6 and the rear-side turn-on breakdown structure 57 into the inner region 7. At first, FIG. 11b shows, starting from x=0, the very flat profile of the, for example boron-doped, $p^{++}$-region of the base region 6 with a high concentration of preferably about 5E18 $cm^{-3}$ and a penetration depth of preferably about 5 to 20 μm in the form of a continuous curve. This is followed, with an increasing penetration depth x, by the concentration profile of the, for example phosphorus- or arsenic-doped, $n^{++}$-turn-on or breakdown structure 57, which is shown in FIG. 11b as a dotted curve. It is clearly apparent in FIG. 11b that the concentration N of the highly doped $n^{++}$-breakdown structure 57 is significantly smaller than the concentration N of the $p^{++}$-region of the base region 6 preceding it on the rear side. As the penetration depth x increases further, the concentration profile of the breakdown structure 57 transitions into the curve of the weakly $n^-$-doped inner region 7.

FIG. 11c shows the concentration profile along the profile line Nc shown in FIG. 10, which extends from the rear side 4 of the semiconductor body 58 through the rear-side base region 6 into the inner region 7. At first, FIG. 11c shows, starting from x=0, the very flat profile of the, in this case boron-doped, $p^{++}$-region of the base region 6 with a high concentration of preferably about 5E18 $cm^{-3}$ and a penetration depth of preferably about 5 to 20 μm in the form of a continuous curve. This is followed, with an increasing penetration depth x, by the concentration profile of the rest of the p-doped base region 6 with a significantly lower concentration N (in this case less than 1E16 $cm^{-3}$), which is shown in FIG. 11c as a dotted curve. Preceding it in the direction of the inner region 7, the rear-side base region 6, just like the front-side base region 8 (see FIG. 11a), also has a weakly aluminum-doped (Al) p-region of the base region 6 with a concentration of about 1E15 $cm^{-3}$ in a penetration depth x of up to about 100 μm, as is shown with a dashed curve in FIG. 11c. However, this Al-doped p-region of the base region 6 is not an absolute requirement. Again, this region of the base region 6 is followed by the weakly $n^-$-doped inner region 7, as is shown in FIG. 11b.

It is particularly preferred to provide the front- and/or rear-side base regions 8 or 6 with a penetration depth or thickness of at least 50 μm, e.g. of about 100 μm, in the area of the concentration profile lines Na and Nc indicated in FIG. 10, as is also apparent from FIGS. 11a and 11c.

As was already mentioned with respect to the description of FIG. 10, the adjustable breakdown voltage of the breakdown structure 57 in the blocking direction is determined by the additionally introduced amount of donor atoms forming the $n^{++}$-breakdown structure 57 shown in FIG. 10. The higher this concentration, the lower the breakdown voltage. The level of concentration of the $p^{++}$-region of the p-doped rear-side base region 6 at the transition towards the $n^{++}$-breakdown structure 57 and the course of the concentration of the $p^{++}$-profile of the base region 6 at the transition towards the $n^{++}$-breakdown structure 57 (see FIG. 11b) also determine the breakdown voltage: the flatter the gradient of the concentration profile at the transition from the $p^{++}$-region of the base region 6 to the $n^{++}$-region of the breakdown structure 57, the greater the blocking capacity if conditions are otherwise unchanged. Subsequent to the diffusion of the flat, highly doped $p^{++}$-region of the base region 6, for example, the blocking capacity of the breakdown structure 57 can be adjusted by means of the drive-in time of the $p^{++}$-region, because as the drive-in time increases, the concentration gradient at the transition from the $p^{++}$-region of the base region 6 to the $n^{++}$-region of the breakdown structure 57 becomes flatter, which increases the breakdown voltage. Thus, a very flat (low penetration depth x) and very highly doped $p^{++}$-profile of the base region 6 has to be produced for very small breakdown voltages of the breakdown structure 57. For example, an assumed breakdown voltage of about 30 V thus results in a mean concentration of the $n^{++}$-region of the breakdown structure 57 of about 5E16 $cm^{-3}$.

The blocking capacity of the breakdown structure 57 can be adjusted across a broad range. It reaches its limit, however, if the concentration becomes very small and comes close to the concentration of the weakly $n^-$-doped inner region 7, which, for example for high-blocking semiconductor components, may have a concentration N of less than 1E14 $cm^{-3}$. In contrast, the breakdown voltage of the breakdown structure 57 can be adjusted very well if its blocking capacity differs very clearly from the maximum possible blocking capacity of the short-circuit semiconductor component 56 determined by the silicon thickness $W_n$ and the concentration N of the weakly doped inner region 7, that is, if it is less than 100 V, wherein the demanded blocking capacity of the short-circuit semiconductor component 56 is then significantly higher than 1000 V, i.e. if the ratio of the maximum possible blocking capacity of the short-circuit semiconductor component 56 to the set blocking capacity of the breakdown structure 57 is in a range of about 50 to about 100.

The breakdown structure 57 described in FIG. 10 may be used as a turn-on structure and/or trigger structure in the short-circuit semiconductor component according to the invention in the same manner as the other breakdown structures described herein. The turn-on or breakdown structure 57 of the short-circuit semiconductor component 56 can be configured as a circumferentially closed ring and/or polygon structure.

FIG. 12 shows a vertical section through another exemplary embodiment of a short-circuit semiconductor component 59 according to the invention with two turn-on structures 30 and 57 and two trigger structures 20 and 60. In a semiconductor body 61, in addition to the embodiment of the short-circuit semiconductor component 56 shown in FIG. 10, the front-side breakdown structure configured as a trigger structure 60 is disposed, in the vertical direction v, underneath the front-side trigger structure 20 configured as a gate electrode 20. Structurally, the trigger structure 60 has the same configuration as the rear-side turn-on structure 57, as is apparent from FIG. 12. In order to embed the breakdown structure 60 into the front-side base region 8, the latter, like the rear-side base region 6, is divided into a highly doped flat $p^{++}$-region facing towards the front side 5 and a common p-region facing towards the inner region 7, so that the $p^{++}$-region, in the vertical direction v, is disposed between the gate electrode 20 and the $n^{++}$-region of the breakdown structure 60. The front-side emitter structure 30 is embedded into the front-side base region 8, adjacent to the front side 5, and electrically conductively contacted by the front-side electrode 10.

Accordingly, in the short-circuit semiconductor component 59 shown in FIG. 12, the front-side turn-on structure 30 may be turned on both by an electrical turn-on signal externally supplied to the gate connection G, but also by the trigger structure 60 if the blocking voltage, which is applied thereto and determined by the main electrodes 10 and 11, exceeds the breakdown voltage predetermined for the breakdown structure 60. In this case, the breakdown current at the breakdown structure 60 increases to the extent that it turns on the turn-on structure 30 embedded into the same base region 8, which ultimately results in the desired shorting of the short-circuit semiconductor component 59.

In the case shown in FIG. 12 of the combination of the two trigger structures 20 and 60 disposed in the same base region (in this case the front-side base region 8), it must be understood that the triggering or turn-on sensitivity of the turn-on structure (in this case the emitter structure 30), which is associated with and downstream of these two trigger structures 20 and 60, is adapted to the turn-on current that can be made available by the trigger structures 20 or 60, with the smallest turn-on current that can be made available by a trigger structure being the determining factor. In other words, due to the presence of the trigger structure, which is configured as a breakdown structure 60 and which typically supplies turn-on currents only in the mA-range, in the range of considerably below 1 A, preferably about 50 mA, the turn-on structure 30 in the example shown in FIG. 12 is designed for a minimum turn-on current, starting from which the turn-on structure 30 is reliably turned on, so that the blocking current generated by the breakdown structure 60 in the case of a breakdown can reliably turn on the turn-on structure 30 without being destroyed itself. This could happen if the triggering or turn-on sensitivity of the turn-on structure 30 were selected to be too high. In that case, the emitter structure 30 could be triggered by a turn-on signal in the range of about 1 A supplied via the gate electrode 20, but the breakdown structure 60 disposed underneath the gate electrode 20 would be destroyed in the process, because it would be overloaded given a turn-on current of 1 A introduced via the gate electrode 20. Since the trigger structure 60 is not located in the region of the semiconductor body 61 covered by the electrode 10 and the contact disk 18, such a destruction of the trigger structure 60 could result in plasma escaping from the region of the non-covered center 13, which is reliably prevented, however, by the above-described design of the turn-on structure 30 or its turn-on sensitivity in the exemplary embodiment of the short-circuit semiconductor component 59 shown in FIG. 12.

FIG. 13 shows a partial plan view of yet another exemplary embodiment of a short-circuit semiconductor component 62 according to the invention with a turn-on structure 63 having a turn-on structure segment 64, which is open in a circumferential direction u of the semiconductor body, and a trigger structure 20. Only the front-side base region 8 of the semiconductor body can be seen in the plan view of FIG. 13. The illustration of FIG. 13 does not show the front-side electrode 10, but only its radial inner edge 65, in order to be able to see the turn-on structure 63, which is disposed underneath the electrode 10 and configured as an emitter structure. It is apparent from FIG. 13 that the emitter structure 63 or the emitter structure segment 64 in this exemplary embodiment has a radial distance from the trigger structure or gate electrode 20. As is also apparent, the turn-on structure 63 is not closed in the circumferential direction u of the semiconductor body in this case, i.e. the turn-on structure 63 of the short-circuit semiconductor component 62 shown in FIG. 13 does not have a closed ring and/or polygon structure. The turn-on structure segment 64 has the lateral emitter structure width $W_{SV}$ and a circumferential emitter structure width $W_{UV}$ extending in the circumferential direction. The circumferential emitter structure width $W_{UV}$ is smaller than a circumferential turn-on structure width, which would correspond to a closed ring and/or polygon structure of the turn-on structure, and thus to a circumferential angle of the closed ring and/or polygonal turn-on structure of 360 degrees.

In the exemplary embodiment of the short-circuit semiconductor component 62 shown in FIG. 13, the turn-on current for turning on the turn-on structure 63 is set to a range around 2 A, preferably between about 1 A and about 5 A. $W_{SV}$ can now be selected so as to be so large that the turn-on structure 63 does not cause any problems with respect to the process, i.e. can be realized with a sufficient width $W_{SV}$. If $W_{SV}$ is selected so as to be too small, there is the problem that the radially inner electrode edge 65 does not cover the emitter structure 64, which in this case is highly n-doped, with sufficient reliability and accuracy, wherein the circumferential structure width $W_{UV}$ is less critical in this case. With the exemplary embodiment shown in FIG. 13, relatively small fusing currents can be realized in a particularly advantageous manner, due to dimensions $W_{SV}$ and $W_{UV}$ that, compared to a closed ring and/or polygon structure, are relatively small, wherein the turn-on current required for turning on the turn-on structure 63 may reach rather large values in the range of preferably about 1 A to about 5 A with the advantages already described herein.

It must be understood that a short-circuit semiconductor component 62 depicted as in FIG. 13 may also have more than one turn-on structure 63, which in that case are distributed in the circumferential direction u of the semiconductor body, preferably equidistantly from one another, in order to obtain a circumferentially substantially symmetrical configuration of such a short-circuit semiconductor component with the advantages already described herein.

FIG. 14 shows a partial plan view of yet another exemplary embodiment of a short-circuit semiconductor component 66 according to the invention with the turn-on structure 63 already shown in FIG. 13, which has at least one turn-on structure segment 64, and a trigger structure 20. The illustration of FIG. 14 does not show the front-side electrode 10, but only its radial inner edge 65, in order to be able to see the turn-on structure 63, which is disposed underneath the electrode 10 and configured as an emitter structure.

As is apparent from FIG. 14, a $p^{--}$-portion 67, which has a considerably lower level of p-doping compared with the customarily p-doped base region portion and which, compared with the rest of the base region 8, constitutes a considerably higher electrical resistance, is provided in the short-circuit semiconductor component 66 in the p-doped front-side base region 8 into which the turn-on structure 63 is embedded. The dopant concentration of this resistance portion 67 preferably is about 1E15 cm$^{-3}$ to about 1E16 cm$^{-3}$ at a penetration depth of preferably about 60 to 120 µm. This resistance portion 67 has an on-state channel 68 opposite the turn-on structure segment 64, which is formed by the ordinarily doped rest of the p-region of the base region 8 and electrically couples the turn-on structure segment 64 to the trigger structure or the gate electrode 20 directly via the p-region of the base region 8.

The effect of the embodiment of the short-circuit semiconductor component 66 shown in FIG. 14 is that, on the one hand, very small fusing currents resulting in shorting can be realized by means of the segment-like configuration of the turn-on structure 63, as is also the case in the short-circuit semiconductor component 62 shown in FIG. 13, and, on the other hand, the turn-on current flowing from the trigger structure 20 to the turn-on structure 63 is directed in a targeted manner on to the turn-on structure segment 64 in order to reliably turn it on for initiating the shorting, if required. As a result, the targeted design of the short-circuit semiconductor component 66 with turn-on currents which, in contrast to what is the case in the short-circuit semiconductor component 62 shown in FIG. 13, are in the mA-range, e.g. at about 150 mA, is possible.

Incidentally, the channel 68 may have different shapes, e.g. also a trapezoidal shape in which the channel 68 tapers from the trigger structure 20 towards the turn-on structure segment 64, in order to achieve an even more targeted guidance of the turn-on current flowing through this channel 68 on to the turn-on structure segment 64 and thus keep the turn-on current flowing past the turn-on structure segment 64 as small as possible.

FIG. 15 shows a vertical section through the short-circuit semiconductor component 66 shown in FIG. 14 along the line of cut X-X shown in FIG. 14. It is apparent that in a semiconductor body 69, particularly in the front-side p-doped base region 8, the p$^{---}$-resistance portion 67 extends laterally between the trigger structure or gate electrode 20 and the inner edge 65 of the front-side electrode 10. The turn-on structure segment 64 cannot be seen in the vertical section X-X.

FIG. 16 shows a partial plan view of yet another exemplary embodiment of a short-circuit semiconductor component 70 according to the invention, which substantially corresponds to the exemplary embodiment of the short-circuit semiconductor component 66 shown in FIG. 14, wherein the turn-on structure segment 64 of the short-circuit semiconductor component 70 in FIG. 16 is electrically directly connected to the trigger structure or the gate electrode 20 via a shunt resistor 71 in the form of an n-doped (e.g. phosphorus-doped) strip-shaped area disposed in the channel 68. Preferably, the width of this shunt resistor 71 may be set to about 55 µm. In this way, the required turn-on current for turning on the turn-on structure 63 can be increased again slightly, compared with the short-circuit semiconductor component 66 of FIG. 14, e.g. to about 400 mA and preferably to a range of about 400 mA to about 1000 mA, with otherwise identical dimensions.

The serpentine shape of the shunt resistor 71 shown in FIG. 16 makes it possible to vary a length of the shunt resistor 71 in a desired manner in order thus to adjust the turn-on current almost arbitrarily within the above-mentioned range. The length of the serpentine shunt resistor 71 shown in FIG. 16 within the channel 68 may be set to a value of, for example, from a range around about 200 µm, i.e. 150 µm to about 250 µm, for example.

With its radially inner end, the shunt resistor 71 is electrically directly connected to the gate electrode 20. In the short-circuit semiconductor component 70 shown in FIG. 16, the opposite radially outer end of the shunt resistor 71 leads directly into the emitter structure segment 64.

Instead of being arranged in the on-state channel 68, as is shown in FIG. 16, the shunt resistor 71 could also be placed across the resistance portion 67. In this case, the radially outer end of the shunt resistor 71 would be electrically directly connected to the front-side electrode 10, e.g. at the electrode edge 65.

FIG. 17 shows a partial plan view of yet another exemplary embodiment of a short-circuit semiconductor component 72 according to the invention with a turn-on structure 63 having a turn-on structure segment 64, which is open in a circumferential direction u of the semiconductor body, and a trigger structure 20. The illustration of FIG. 17 substantially corresponds to the illustration of FIG. 14, with the exception that in the short-circuit semiconductor component 72 shown in FIG. 17, an n-doped resistance portion 73, which is also referred to as a pinch resistor 73, is inserted into the p-doped front-side base region 8.

FIG. 18 shows a vertical section through the short-circuit semiconductor component 72 shown in FIG. 17 along the line of cut Y-Y shown in FIG. 17. It is apparent in this view that the resistance portion 73 is formed by a pinch resistor which, as an n-region which is inserted into a semiconductor body 74, and especially into the front-side base region 8 from the front side 5 and adjacent to the latter, significantly reduces the effective conduction cross-section of the front-side base region 8 between the trigger structure 20 and the front-side electrode 10, whereby the pinch resistor 73 causes an increase of the surface area-specific resistance in this area of the base region 8. The effects of this increase of resistance were already described above with regard to FIGS. 14 to 16.

It must be understood that the embodiments of the turn-on structure 63 described in connection with FIGS. 13 to 18, with individual turn-on structure segments 64 in combination with the local increase of resistance in the base region 8 between the trigger structure 20 and the turn-on structure segment 64, can be combined in any manner with all other turn-on structures and/or trigger structures described herein, thus containing further advantageous embodiments of the invention not shown in the Figures. For example, two radially spaced-apart turn-on structures, which are electrically insulated from one another, may be provided, e.g. at least one turn-on structure segment 63 as shown in FIGS. 13 to 18, which is surrounded by a fingered turn-on structure, which is disposed radially further outwards and closed in a ring and/or polygon shape, e.g. similar to that shown in FIG. 3. Thus, the shorted region within the region of the semiconductor body covered by the front- and/or rear-side electrodes, which is produced after the short-circuit semiconductor component has been turned on, can be advantageously expanded in the radial direction, with the advantages already described herein.

The above-described short-circuit semiconductor component according to the invention is not limited to the embodiments disclosed herein, but in each case also includes embodiments having the same effects, which result from technically viable other combinations of the features of the short-circuit semiconductor component described herein. In particular, an n-p-n sequence of layers, which is inverse to the p-n-p structure of the semiconductor body shown in the exemplary embodiments, is also conceivable. In this case, the weakly n-doped inner semiconductor region consists of a weakly p-doped inner region, and each of the front- and rear-side base regions of an n-doped layer, etc. The conduction types of the turn-on structures described herein would also have to be inverted in such a case.

In a preferred embodiment, the short-circuit semiconductor component according to the invention is used as a contact or personnel protection device, as well as for plant protection.

LIST OF REFERENCE NUMERALS

1 Prior art thyristor
2 Semiconductor body
3 Center axis
4 Rear side
5 Front side
6 Rear-side base region
7 Inner region
8 Front-side base region
9 Front-side emitter
10 Front-side electrode
11 Rear-side electrode
12 Short circuit
13 Front and rear-side center
14 Gate electrode
15 Short-circuit semiconductor component
16 Semiconductor body
17 Front-side turn-on structure/emitter structure
18 Front-side contact disk
19 Rear-side contact disk
20 Trigger structure, gate electrode
21 Shorting
22 Short-circuit semiconductor component
23 Fingered turn-on structure/emitter structure
24 Front-side electrode
25 Semiconductor body
26 Trigger structure, gate electrode
27 Trigger structure finger/gate finger
28 Turn-on structure finger of 23
29 Short-circuit semiconductor component
30 Front-side turn-on structure/emitter structure
31 Rear-side turn-on structure/breakdown structure
32 Semiconductor body
33 Critical radius of curvature
34 Short-circuit semiconductor component
35 Front-side turn-on structure/emitter structure
36 Rear-side turn-on structure/emitter structure
37 Front-side trigger structure/gate electrode
38 Rear-side trigger structure/gate electrode
39 Semiconductor body
40 Short-circuit semiconductor component
41 Front-side turn-on structure/emitter structure
42 Front-side trigger structure/photosensitive portion/optical gate
43 Semiconductor body
44 Optical signal
45 Short-circuit semiconductor component
46 Rear-side turn-on structure/emitter structure
47 Rear-side trigger structure/breakdown structure
48 Semiconductor body
49 Short-circuit semiconductor component
50 Front-side turn-on structure/breakdown structure
51 Semiconductor body
52 Short-circuit semiconductor component
53 Rear-side turn-on structure/emitter structure
54 Front-side trigger structure/breakdown structure
55 Semiconductor body
56 Short-circuit semiconductor component
57 Rear-side turn-on structure/breakdown structure
58 Semiconductor body
59 Short-circuit semiconductor component
60 Front-side trigger structure/breakdown structure
61 Semiconductor body
62 Short-circuit semiconductor component
63 Front-side turn-on structure/emitter structure
64 Turn-on structure segment/emitter structure segment
65 Radial inner edge
66 Short-circuit semiconductor component
67 Resistance portion
68 On-state channel
69 Semiconductor body
70 Short-circuit semiconductor component
71 Shunt resistor
72 Short-circuit semiconductor component
73 Resistance portion/pinch resistor
74 Semiconductor body
A Anode connection
Al Aluminum
AG Amplifying gate
$D_a$ Outer diameter of BOD structure
$D_{a*}$ Outer diameter of BOD structure
$D_i$ Inner diameter of BOD structure
$D_{i*}$ Inner diameter of BOD structure
$E_V$ Front-side electrode connection
$E_R$ Rear-side electrode connection
G Gate connection
$G_V$ Front-side gate connection
$G_R$ Rear-side gate connection
K Cathode connection
$L_{SF}$ Radial finger length of turn-on structure
N Dopant concentration
Na Concentration profile line (a)
Nb Concentration profile line (b)
Nc Concentration profile line (c)
r Radial/lateral direction
R Limiting resistance
u Circumferential direction
v Vertical direction
x Penetration depth
$W_{E1}$ Prior-art lateral electrode width
$W_{ER}$ Lateral rear-side electrode width
$W_{EV}$ Lateral front-side electrode width
$W_n$ Thickness of inner region
$W_{n1}$ Thickness of inner region according to prior art
$W_{S1}$ Lateral emitter width according to prior art
$W_{SR}$ Lateral rear-side turn-on structure width
$W_{SV}$ Lateral front-side turn-on structure width
$WU_V$ Circumferential front-side turn-on structure width
X-X Line of cut of vertical section
Y-Y Line of cut of vertical section

The invention claimed is:

1. A short-circuit semiconductor component comprising a semiconductor body, in which a rear-side base region of a first conduction type, an inner region of a second conduction type complementary to the first conduction type, and a front-side base region of the first conduction type are successively arranged in a vertical direction starting from a rear side with a rear-side center determined by its geometric center of gravity towards a front side, which is opposite to the rear side, with a front-side center determined by its geometric center of gravity, wherein the rear-side base region is connected in an electrically conductive manner to a rear-side electrode with a lateral rear-side electrode width ($W_{ER}$) determined by its lateral extent, which is applied to the rear side, and the front-side base region is connected in an electrically conductive manner to a front-side electrode with a lateral front-side electrode width ($W_{EV}$) determined by its lateral extent, which is applied to the front side, wherein at least one front-side turn-on structure with a lateral front-side turn-on structure width ($W_{SV}$) determined by its lateral extent is embedded in the front-side base region and at least partially covered by the front-side electrode and/or at least one rear-side turn-on structure with a lateral rear-side turn-on structure width ($W_{SR}$) determined by its lateral extent is embedded in the rear-side base region and at least partially covered by the rear-side electrode, wherein each turn-on structure is configured and arranged in such a way that it is turned on depending on a predeterminable turn-on signal supplied to the semiconductor body and produces, on a one-off basis, a permanent, irreversible, electrically conductive, low-resistance connection between the front-side electrode and the rear-side electrode, by a ratio of the lateral front-side turn-on structure width ($W_{SV}$) to the lateral front-side electrode width ($W_{EV}$) being less than 1 if the front-side turn-on structure is present, and a ratio of the lateral rear-side turn-on structure width ($W_{SR}$) to the lateral rear-side electrode width ($W_{ER}$) being less than 1 if the rear-side turn-on structure is present, wherein each turn-on structure is an emitter structure of the second conduction type, which is embedded into the front-side or rear-side base region and contacted in an electrically conductive manner with the electrode applied to the respective base region, and which can be turned on by means of at least one trigger structure which, via the semiconductor body, acts on it electrically, wherein each trigger structure can in turn be activated by means of the turn-on signal, characterized in that a sheet resistance of the base region containing the emitter structure is set in such a way that a minimum turn-on current obtained from the turn-on signal and supplied to the emitter structure has a current intensity of at least 1 A for turning on the emitter structure.

2. The short-circuit semiconductor component according to claim 1, characterized in that the ratio of the lateral turn-on structure width ($W_{SV}$, $W_{SR}$) to the corresponding lateral electrode width ($W_{EV}$, $W_{ER}$) of the respective electrode is selected so as to be less than 4/5.

3. The short-circuit semiconductor component according to claim 1, characterized in that the turn-on structure is completely covered by the front-side electrode and the rear-side electrode.

4. The short-circuit semiconductor component according to claim 1, characterized in that the front-side electrode and the rear-side electrode cover the front-side or rear-side center, respectively, of the semiconductor body, and the turn-on structure is disposed in the corresponding center.

5. The short-circuit semiconductor component according to claim 1, characterized in that each trigger structure is a gate electrode, and the turn-on signal is an electrical signal supplied to the gate electrode.

6. The short-circuit semiconductor component according to claim 1, characterized in that the trigger structure is a photosensitive portion disposed in the base region containing the emitter structure, and the turn-on signal is an optical signal supplied to this photosensitive portion.

7. The short-circuit semiconductor component according to claim 1, characterized in that the trigger structure is a breakdown structure, and the turn-on signal is the electrical voltage present between the front-side electrode and the rear-side electrode.

8. The short-circuit semiconductor component according to claim 1, characterized in that an amplifying gate structure with at least one amplifying gate (AG) is disposed in the base region containing the emitter structure between the trigger structure and the emitter structure electrically operatively connected therewith.

9. The short-circuit semiconductor component according to claim 1, characterized in that a thickness ($W_n$) of the inner region in the vertical direction is greater than 400 μm.

10. The short-circuit semiconductor component according to claim 1, characterized in that the emitter structure is interspersed with short-circuits having a width greater than 100 μm.

11. The short-circuit semiconductor component according to claim 1, characterized in that the turn-on structure is spaced apart in a radial direction from the trigger structure and has at least one turn-on structure segment with a circumferential turn-on structure width ($W_{UV}$), which is open in a circumferential direction of the semiconductor body.

12. The short-circuit semiconductor component according to claim 11, characterized in that at least two turn-on structure segments that are separate from each other are provided in the circumferential direction of the semiconductor body.

13. The short-circuit semiconductor component according to claim 11, characterized in that the electrical resistance in the base region containing the turn-on structure is increased at least in a portion of the radial interspace between the turn-on structure and the trigger structure with the exception of at least one forward channel electrically coupling the at least one of the turn-on structure segments with the trigger structure.

14. The short-circuit semiconductor component according to claim 1, characterized in that the turn-on structure has at least one turn-on structure finger extending radially outwards from the rest of the turn-on structure in the lateral direction.

15. The short-circuit semiconductor component according to claim 14, characterized in that the trigger structure has at least one trigger structure finger, which follows the contour of the at least one turn-on structure finger.

16. The short-circuit semiconductor component according to claim 14,
characterized in that
the at least one turn-on structure finger has a maximum radial finger length ($L_{SF}$) which is smaller than ⅘ of the lateral electrode width ($W_{EV}$, $W_{ER}$) of the electrode applied to the base region containing the turn-on structure.

17. The short-circuit semiconductor component according to claim 1,
characterized in that
the front-side electrode and the rear-side electrode are each press-contacted in an electrically conductive manner by means of a metallic contact disk.

18. The short-circuit semiconductor component according to claim 17,
characterized in that
a lateral width of the respective contact disk corresponds to the lateral electrode width ($W_{EV}$, $W_{ER}$) of the corresponding press-contacted electrode.

* * * * *